United States Patent
Kanai et al.

(10) Patent No.: US 9,984,746 B2
(45) Date of Patent: May 29, 2018

(54) NONVOLATILE MEMORY DEVICE THAT STORES DATA FROM COMPLETED WRITE REQUESTS ON A POWER ABNORMALITY

(71) Applicant: TOSHIBA MEMORY CORPORATION, Minato-ku (JP)

(72) Inventors: Tatsunori Kanai, Yokohama (JP); Tetsuro Kimura, Tokyo (JP); Masaya Tarui, Kanagawa (JP); Yusuke Shirota, Yokohama (JP); Shiyo Yoshimura, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 112 days.

(21) Appl. No.: 15/005,409

(22) Filed: Jan. 25, 2016

(65) Prior Publication Data

US 2016/0284402 A1    Sep. 29, 2016

(30) Foreign Application Priority Data

Mar. 24, 2015  (JP) .................................. 2015-060811

(51) Int. Cl.
G06F 3/06       (2006.01)
G06F 13/16      (2006.01)
G11C 13/00      (2006.01)
G11C 11/16      (2006.01)

(52) U.S. Cl.
CPC ........ *G11C 13/0038* (2013.01); *G06F 3/0617* (2013.01); *G06F 3/0653* (2013.01); *G06F 3/0656* (2013.01); *G06F 3/0688* (2013.01); *G11C 11/1675* (2013.01); *G11C 11/1697* (2013.01); *G11C 13/0069* (2013.01); *G11C 13/0004* (2013.01); *G11C 13/0007* (2013.01)

(58) Field of Classification Search
CPC .... G06F 3/0619; G06F 3/0646; G06F 3/0656; G06F 3/0683; G06F 3/0685; G06F 3/0688; G06F 13/1673
See application file for complete search history.

(56) References Cited

U.S. PATENT DOCUMENTS

| | | | |
|---|---|---|---|
| 8,533,404 B2 | 9/2013 | Condit et al. | |
| 2004/0268026 A1* | 12/2004 | Royer, Jr. | ........... G06F 12/0802 711/104 |
| 2008/0052449 A1* | 2/2008 | Kim | .................... G06F 13/1678 711/103 |
| 2008/0320245 A1* | 12/2008 | Tomlin | .................... G06F 9/466 711/154 |
| 2012/0166715 A1* | 6/2012 | Frost | .................... G06F 11/1068 711/103 |

(Continued)

Primary Examiner — Hal Schnee
(74) Attorney, Agent, or Firm — Oblon, McClelland, Maier & Neustadt, L.L.P.

(57) ABSTRACT

According to an embodiment, a memory device includes a nonvolatile memory, a controller, and power storage. The controller is configured to receive, from a host device, a write request for writing data into the nonvolatile memory, and then, write the data based on the write request. The power storage is configured to store power supplied from a power supply. The controller writes, when abnormality in power supplied from the power supply to the memory device is detected, the data based on the write request that has already been received, using the power supplied from the power storage.

14 Claims, 30 Drawing Sheets

(56) References Cited

U.S. PATENT DOCUMENTS

| | | | |
|---|---|---|---|
| 2014/0075122 A1* | 3/2014 | Banikazemi | G06F 11/00 711/133 |
| 2016/0004452 A1* | 1/2016 | Hayes | G06F 3/065 714/758 |

* cited by examiner

FIG.26

| COMMAND | TAG | DATA | CRC |
|---|---|---|---|

FIG.27

| 64-BYTE WRITE REQUEST | - | 108A0 | 8F 42 ⋯ 0B 9D | CRC |
|---|---|---|---|---|

FIG.28

| 64-BYTE READ REQUEST | 7 | 21B498 | CRC |

FIG.29

| 64-BYTE READ RESPONSE | 7 | 48 BD ⋯ 53 A4 | CRC |

FIG.37

| 1 | 64-BYTE WRITE REQUEST | - | 108A0 | 8F 42 ⋯ 0B 9D | CRC |

FIG.38

| 1 | 64-BYTE READ REQUEST | 7 | 21B498 | CRC |

FIG.39

| 0 | 64-BYTE READ RESPONSE | 7 | 48 BD ⋯ 53 A4 | CRC |

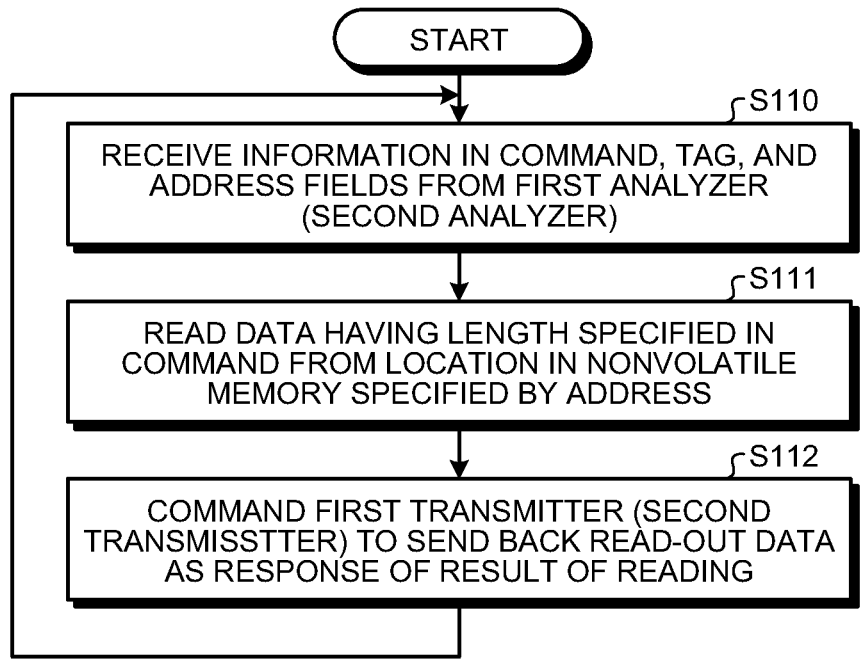
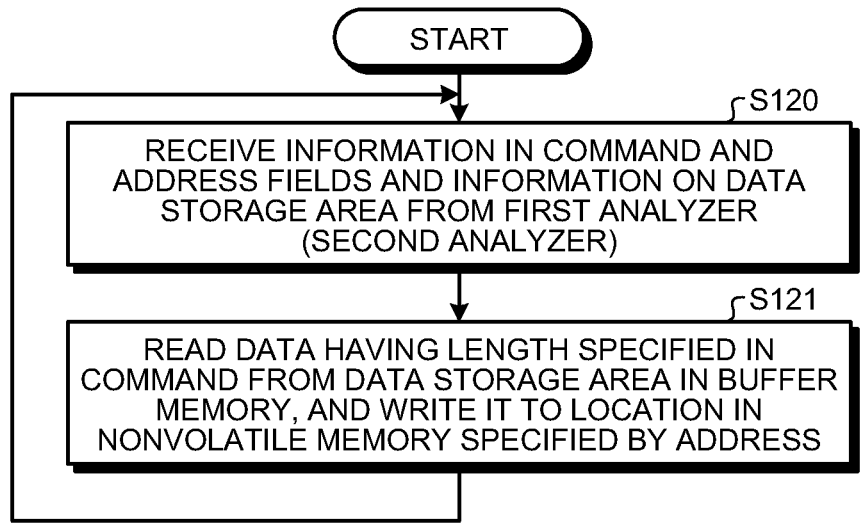

NONVOLATILE MEMORY DEVICE THAT STORES DATA FROM COMPLETED WRITE REQUESTS ON A POWER ABNORMALITY

CROSS-REFERENCE TO RELATED APPLICATION

This application is based upon and claims the benefit of priority from Japanese Patent Application No. 2015-060811, filed on Mar. 24, 2015; the entire contents of which are incorporated herein by reference.

FIELD

Embodiments described herein relate generally to a memory device, a semiconductor device, and an information processing device.

BACKGROUND

Suppose that a failure occurs in a computer system that uses, as a main memory, a byte-addressable nonvolatile memory, such as an MRAM, a PCM, or memristors, that can be directly connected to a memory bus of a processor. In that case, in order to be capable of continuing processing from a consistent state immediately before the failure occurred, the computer system needs to ensure ordering (property of orderliness) and atomicity (property of not stopping writing halfway) of writing into the nonvolatile memory performed by a computer program executed on the processor.

For example, a technique for ensuring the atomicity is known in which a capacitor is provided to ensure that a memory controller connected to a CPU (memory controller of a host device, from another point of view) completes the writing of data into the nonvolatile memory when power supply is lost.

With increases in operation speed of memories, recent years have seen the development of memory devices (such as Hybrid Memory Cube (HMC) and QuickPath Interconnect (QPI) memory devices) each provided thereon with a controller for writing of data into the memory. The memory controller of the processor (memory controller of the host device) connected to each of such memory devices recognizes that the writing of data is completed when transmission of the data (transmission of the writing target data) to the memory device is completed.

The writing target data that has been transmitted to the memory device is, however, written into the memory further via the controller of the memory device, so that the writing target data has not necessarily reached memory cells in the memory at the time when the memory controller of the processor recognizes that the writing of the data is completed. If power supply abnormality occurs (abnormality in power supplied from the power supply occurs) at this moment, a problem occurs in that the data currently being written is lost, or a problem occurs in that incomplete data is written, so that the atomicity cannot be ensured.

BRIEF DESCRIPTION OF THE DRAWINGS

FIG. 26 is a diagram illustrating an example of the structure of a response of the third embodiment;

FIG. 27 is a diagram illustrating an example of a write request of the third embodiment;

FIG. 28 is a diagram illustrating an example of a read request of the third embodiment;

FIG. 29 is a diagram illustrating an example of a response of the third embodiment;

FIG. 37 is a diagram illustrating an example of a write request of the fourth embodiment;

FIG. 38 is a diagram illustrating an example of a read request of the fourth embodiment;

FIG. 39 is a diagram illustrating an example of a response of the fourth embodiment;

FIG. 41 is a diagram illustrating an example of the detailed operation of each reader of the fourth embodiment; and FIG. 42 is a diagram illustrating an example of the detailed operation of the writer of the fourth embodiment.

DETAILED DESCRIPTION

Figure 1:
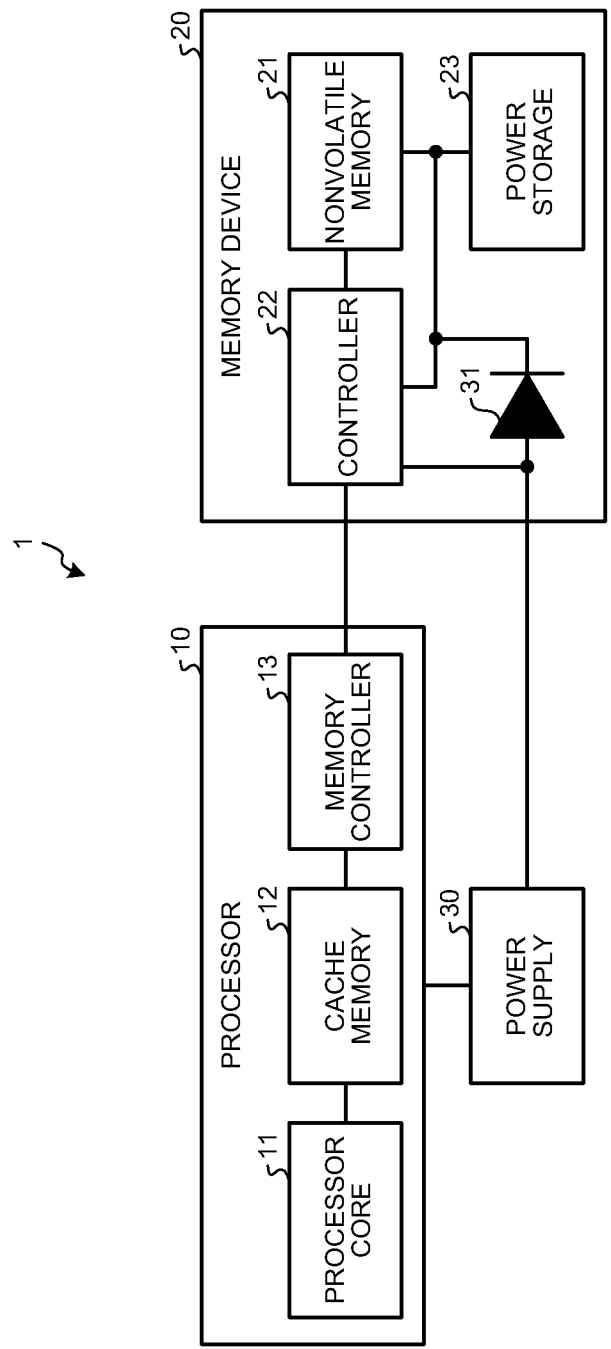
FIG. 1 is a diagram illustrating an example of the configuration of an information processing device according to a first embodiment.

According to an embodiment, a memory device includes a nonvolatile memory, a controller, and power storage. The controller is configured to receive, from a host device, a write request for writing data into the nonvolatile memory, and then, write the data based on the write request. The power storage is configured to store power supplied from a power supply. The controller writes, when abnormality in power supplied from the power supply to the memory device is detected, the data based on the write request that has already been received, using the power supplied from the power storage.

The following describes in detail embodiments of a memory device, a semiconductor device, and an information processing device according to the present invention, with reference to the accompanying drawings.

First Embodiment

The following describes the outline of a first embodiment before explaining the specific details thereof. As described above, a memory controller of a processor (memory controller of a host device) connected to a memory device provided thereon with a controller recognizes that the writing of data is completed when transmission of the data (transmission of the writing target data) to the memory device is completed. The writing target data that has been transmitted to the memory device is, however, written into the memory further via the controller of the memory device, so that the writing target data has not necessarily reached memory cells in the memory at the time when the memory controller of the processor recognizes that the writing of the data is completed. If power supply abnormality occurs at this moment, the problem occurs in that the data currently being written is lost, or the problem occurs in that incomplete data is written.

In addition, interfaces, such as Hybrid Memory Cube (HMC), each for connecting a latest memory device to a processor (here, including a processor core (CPU) and a memory controller) are provided with write requests for data of a plurality of different data sizes, such as 4, 8, 16, 32, and 64 bytes, and can use a different write request according to a command of the processor. The length of the entire write request varies depending on the size of data to be written. The write request is forwarded over a plurality of clock cycles from the processor to the memory device. The size of the write request issued by the processor is normally often set to the same size as that of a cache line (for example, to 64 bytes). In the case of forwarding the write request over a plurality of clock cycles as described above, if the power supply abnormality occurs while the write request is forwarded, the write request may stop being forwarded halfway, or the transmitted information may have an incorrect value. In such a case, the controller (controller of the memory device) should not write data based on the write request that is received halfway. Moreover, even in the case of forwarding the information constituting the write request in parallel from the processor to the memory device, for example, in one clock cycle, the information may fail to be correctly forwarded if the power supply abnormality occurs.

In the present embodiment, after receiving the write request from the memory controller of the processor serving as the host device, the controller of the memory device temporarily stores the received write request in a volatile buffer memory, and, if the entire write request has been correctly received, writes the entire write request into a nonvolatile memory. The controller of the memory device determines whether the entire write request has been correctly received by determining whether information having a size corresponding to that of the write request is received. The size of data of the write request is obtained by referring to the head part (header) of the write request, and the length of the entire write request is obtained based on the obtained size, so that the controller of the memory device can determine whether the entire write request has been correctly received by determining whether the write request having the obtained length is successfully received. Moreover, if, for example, the write request includes a checking code, such as a CRC, the controller of the memory device may use the checking code to check whether the information includes any error. In addition, the controller of the memory device may combine various checking schemes to determine whether the write request has been correctly received.

In the present embodiment, if the abnormality in the power supplied from the power supply to the memory device is detected, the controller of the memory device does not write the data included in the write request currently being received from the processor into the nonvolatile memory. If the controller of the memory device has already received the write request (has already fully received the write request), the controller of the memory device writes data based on the already received write request, using power supplied from power storage for storing the power supplied from the power supply. This operation can ensure the atomicity.

The following describes the specific details of the present embodiment with reference to the accompanying drawings.

FIG. 1 is a diagram illustrating an example of the hardware configuration of an information processing device 1 of the present embodiment. The information processing device 1 can be constituted by, for example, a server, a personal computer (PC), a mobile information terminal (including a portable tablet computer), or a mobile phone. As illustrated in FIG. 1, the information processing device 1 of the present embodiment includes a processor 10, a memory device 20, and a power supply 30. In the example of FIG. 1, the memory device 20 has one port for accessing that is connected to the processor 10, but is not limited to this configuration. The power supply 30 is a device for supplying power to the information processing device 1, and supplies the power to each of the processor 10 and the memory device 20.

The processor 10 is an example of the host device, and includes a processor core (also called a central processing unit (CPU)) 11, a cache memory 12, and a memory controller 13.

In a procedure in which a computer program executed by the processor core 11 writes data into the memory device 20, writing target data is first written into the cache memory 12. To write the data written in the cache memory 12 into the memory device 20, the memory controller 13 issues a write request to the memory device 20 at an appropriate timing. The write request in the present embodiment includes at least the writing target data and address information indicating a location in a nonvolatile memory 21 of the memory device 20 into which the writing target data is to be written. To read data from the memory device 20, the memory controller 13 issues a read request according to a command from the processor core 11. The read request in the present embodiment includes at least address information indicating a location in the nonvolatile memory 21 of the memory device 20 in which the reading target data is stored. In the following description, the write request and the read request will be called simply the "request", when not distinguished, in some cases.

The following describes the configuration of the memory device 20. As illustrated in FIG. 1, the memory device 20 includes the nonvolatile memory 21, a controller 22, power storage 23, and a rectifying device (diode in this example) 31. The memory device 20 can be considered to be an example of the semiconductor device.

In the present embodiment, the nonvolatile memory 21 is constituted by a magnetoresistive random access memory (MRAM), but is not limited to this constitution. The nonvolatile memory 21 may be, for example, a phase-change memory (PCM), a resistive random access memory (Re-RAM), a ferroelectric random access memory (FeRAM), or memristors, or may also be an NVDIMM that combines a dynamic random access memory (DRAM) with a NAND flash memory. The nonvolatile memory 21 may alternatively be a DRAM or an SRAM backed up by a battery.

Figure 2:
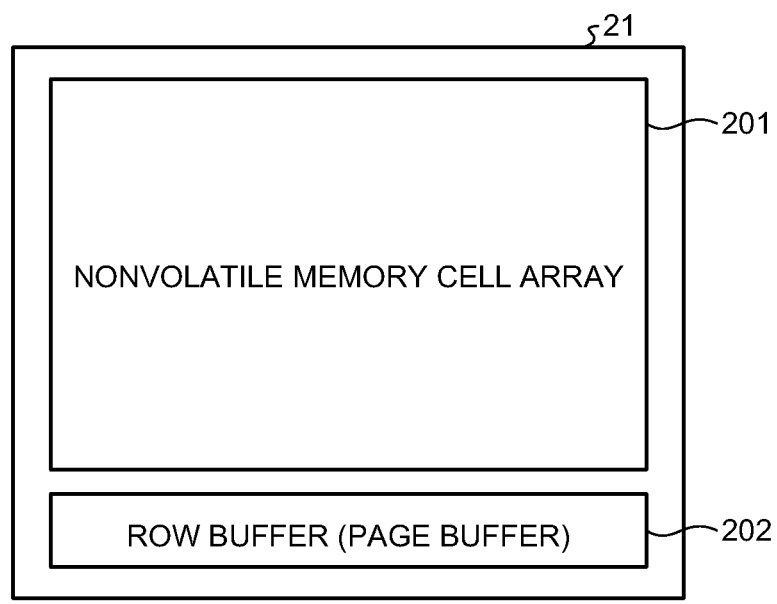
FIG. 2 is a diagram illustrating an example of the configuration of a first nonvolatile memory.

FIG. 2 is a diagram illustrating an example of the schematic configuration of the nonvolatile memory 21 in the present embodiment. As illustrated in FIG. 2, the nonvolatile memory 21 includes a nonvolatile memory cell array 201 and a row buffer (page buffer) 202 that is a volatile memory.

Although no details are illustrated, a plurality of word lines extending in the row direction (in the right-left direction of FIG. 2) and a plurality of bit lines extending in the column direction (in the up-down direction of FIG. 2) are arranged in the nonvolatile memory cell array 201, and the nonvolatile memory cell array 201 includes a plurality of memory cells arranged in a matrix corresponding to intersections between the word lines and the bit lines. Also, although no details are illustrated, the nonvolatile memory cell array 201 includes, for example, a circuit for controlling the voltage of each of the word lines and a circuit for controlling the voltage of each of the bit lines, both under the control of the controller 22. The configuration described above can employ various known configurations. In this example, the data size of a plurality of memory cells connected to one word line is called a "page". The row buffer 202 temporarily stores data for one page corresponding to a word line selected at the time of data writing or data reading. In the present embodiment, data is written into the nonvolatile memory 21 or read from the nonvolatile memory 21 through the row buffer 202, which is the same as a known method.

The description will be continued referring back to FIG. 1. After receiving the write request requesting the writing of the data into the nonvolatile memory 21 from the memory controller 13 of the processor 10, the controller 22 writes the data based on the write request. Also, after receiving the read request requesting the reading of the data from the nonvolatile memory 21 from the memory controller 13 of the processor 10, the controller 22 reads the data based on the read request.

If the abnormality in the power supplied from the power supply 30 to the memory device 20 is detected, the controller 22 of the present embodiment writes the data based on the already received write request, using the power supplied from the power storage 23 for storing the power supplied from the power supply 30. From another point of view, the controller 22 can be considered to write the data based on the already received write request, using the power supplied from the power storage 23 for storing the power supplied from the power supply 30 if the abnormality in the power supplied from the power supply 30 to the "semiconductor device" is detected. The controller 22 can also be considered to write the data based on the already received write request, using the power supplied from the power storage 23 for storing the power supplied from the power supply 30 if the abnormality in the power supplied from the power supply 30 to the "information processing device 1" is detected.

The controller 22 of the present embodiment monitors the voltage of the power supplied from the power supply 30 to the memory device 20, and determines (recognizes) that the abnormality has occurred if the voltage drops to or below a threshold. Specifically, the controller 22 writes the data based on the already received write request, using the power supplied from the power storage 23 for storing the power supplied from the power supply 30 if the voltage of the power supplied from the power supply 30 to the memory device 20 drops to or below the threshold. From another point of view, the controller 22 can be considered to write the data based on the already received write request, using the power supplied from the power storage 23 for storing the power supplied from the power supply 30 if the voltage of the power supplied from the power supply 30 to the "semiconductor device" drops to or below the threshold. The controller 22 can also be considered to write the data based on the already received write request, using the power supplied from the power storage 23 for storing the power supplied from the power supply 30 if the voltage of the power supplied from the power supply 30 to the "information processing device 1" drops to or below the threshold.

If the abnormality in the power supplied from the power supply 30 to the memory device 20 is detected, the controller 22 of the present embodiment stops receiving the write request. In addition, if the abnormality in the power supplied from the power supply 30 to the memory device 20 is detected, the controller 22 does not write the data based on the write request currently being received from the memory controller 13 of the processor 10. Details of the controller 22 of the present embodiment will be described later.

The power storage 23 stores the power supplied from the power supply 30. The amount of the power stored by the power storage 23 is an amount of power required for at least completing the writing into the nonvolatile memory 21 based on the write request received by the memory device 20 from the memory controller 13 of the processor 10 serving as the host device even when the power supply 30 has stopped supplying the power. In the present embodiment, the power storage 23 is constituted by a capacitor, but is not limited to this constitution. The power storage 23 may be constituted by, for example, a battery. The point is that the power storage 23 only needs to be a device that can hold the power from the power supply 30. In the example of FIG. 1, the power supplied from the power supply 30 to the memory device 20 is supplied to each of the nonvolatile memory 21, the controller 22, and the power storage 23, via the rectifying device 31. The operation of the rectifying device 31 can prevent the power stored in the power storage 23 from leaking out of the memory device 20 when the voltage has dropped. In the present embodiment, if the voltage of the power supplied from the power supply 30 to the memory device 20 drops to or below the threshold, the output voltage of the power storage 23 exceeds the voltage of the power supplied from the power supply 30, and the power stored in the power storage 23 is supplied to each of the nonvolatile memory 21 and the controller 22. The power may be switched to be supplied from the power storage 23 to the nonvolatile memory 21 and the controller 22 when the voltage of the power supplied from the power supply 30 has dropped as illustrated in the example of FIG. 1, or may be switched to be supplied from the power storage 23 to the nonvolatile memory 21 and the controller 22 in addition to the power from the power supply 30 when the power supply 30 does not supply a sufficient amount of power.

Figure 3:
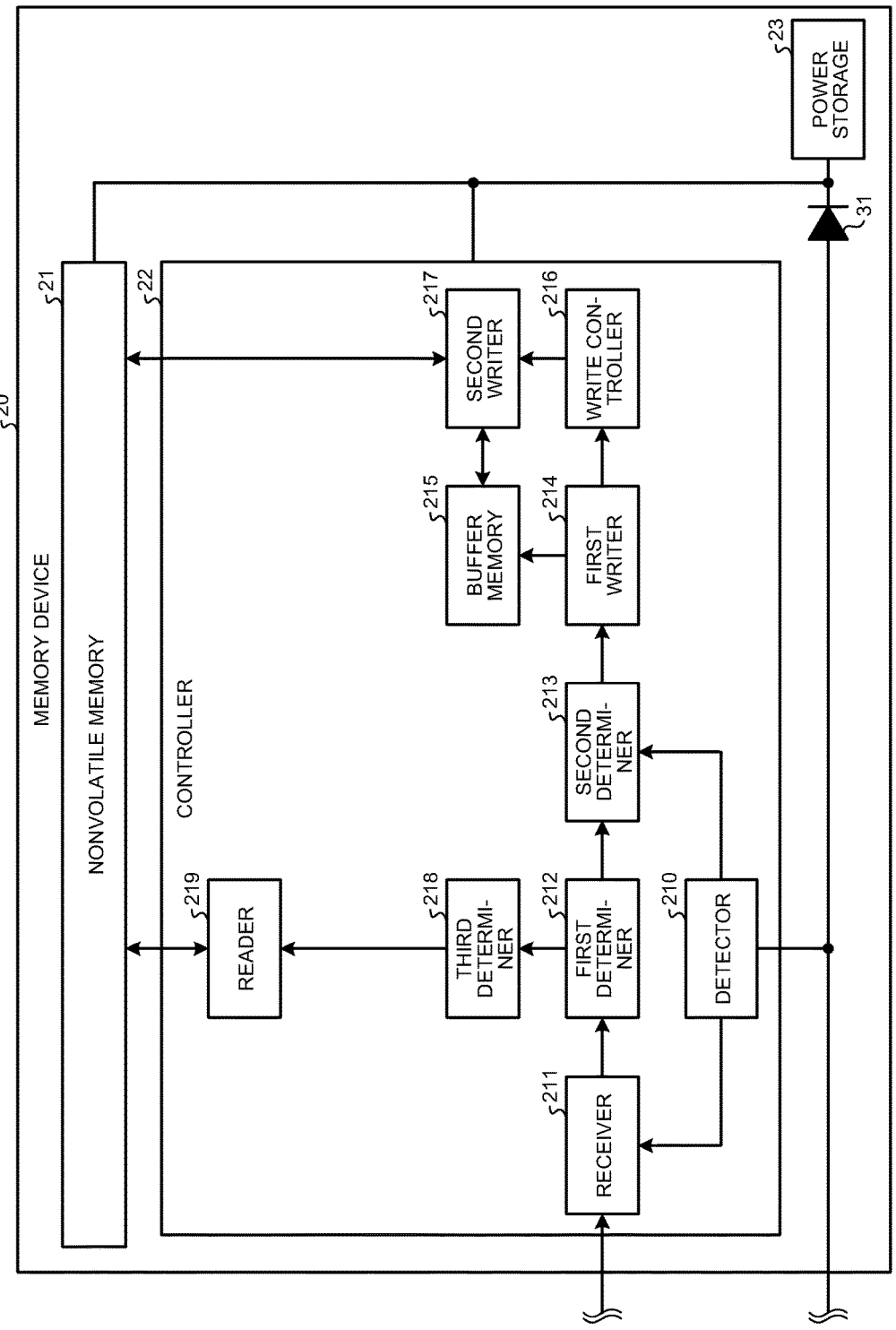
FIG. 3 is a diagram illustrating an example of the detailed configuration of a memory device of the first embodiment.

FIG. 3 is a diagram illustrating an example of the detailed hardware configuration of the memory device 20. As illustrated in FIG. 3, the controller 22 includes a detector 210, a receiver 211, a first determiner 212, a second determiner 213, a first writer 214, a buffer memory 215, a write controller 216, a second writer 217, a third determiner 218, and a reader 219. These components are each constituted by a semiconductor circuit, and may be provided independent of each other, or provided such that any two or more components are integrated.

The detector 210 detects the abnormality in the power supplied from the power supply 30 to the memory device 20. More specifically, the detector 210 monitors the power supplied from the power supply 30 to the memory device 20, and determines that the abnormality has occurred if the voltage of the power supplied from the power supply 30 drops to or below the threshold. After detecting the abnormality in the power supplied from the power supply 30 to the memory device 20, the detector 210 notifies each of the receiver 211 and the second determiner 213 that the abnormality has occurred. The method for detecting the abnormality in the power supplied from the power supply 30 to the memory device 20 is not limited to the method in which the detector 210 measures the voltage of the power supplied from the power supply 30 to the memory device 20, but may be, for example, a method in which the detector 210 receives a signal indicating the abnormality in the power from an external device, such as the power supply 30 or the processor 10.

The receiver 211 receives the request (the write request or the read request) from the memory controller 13 of the processor 10. The controller 22 of the present embodiment receives the request (the write request or the read request) over a plurality of clock cycles. Hence, the receiver 211 can be considered to sequentially receive a plurality of pieces of information constituting the request (called "request information" in some cases in the following description) from the memory controller 13. In the present embodiment, if the notification of the abnormality occurrence is received from the detector 210, the receiver 211 stops receiving the subsequent request (request information).

The first determiner 212 determines whether the request information received by the receiver 211 corresponds to a write request or a read request. Various methods can be considered to make this determination. For example, if the request information corresponding to the header of the request has a format including command information for identifying the type of a command (for identifying whether the command is the write request or the read request), the first determiner 212 refers to the command information included in the request information corresponding to the header of the request received by the receiver 211, and thus can determine whether the request information and certain pieces of request information subsequent thereto correspond to the write request or the read request.

The second determiner 213 determines whether the entire write request has been correctly received. In the present embodiment, whether the entire write request has been correctly received can be determined based on whether a request information group having a data size (predetermined data size) of the entire write request (request information group constituting the write request) has been received. That is, if the total size of the request information group corresponding to the write request received by the receiver 211 over a plurality of clock cycles reaches the predetermined data size, the second determiner 213 can determine that the entire write request has been correctly received. Moreover, if, for example, the write request includes a checking code, such as the CRC, the second determiner 213 may use the checking code to check whether the information includes any error. In addition, the second determiner 213 may combine various checking schemes to determine whether the write request has been correctly received.

If the second determiner 213 determines that the write request has been received (determines that the entire write request has been correctly received), the second determiner 213 commands the first writer 214 to write write information corresponding to the received write request (in other words, the write request that has been fully received) into the buffer memory 215.

In the present embodiment, if the second determiner 213 receives the notification of the abnormality occurrence from the detector 210, the second determiner 213 discards the write request currently being received from the memory controller 13 of the processor 10. Specifically, if the total size of the already received request information group corresponding to the write request has not reached the predetermined data size when the second determiner 213 receives the notification of the abnormality occurrence from the detector 210, the second determiner 213 discards the already received request information group. This operation prevents the memory device 20 from being brought into an inconsistent state in which only a part of the writing target data is written (state in which the writing stops halfway in the process).

After being commanded by the second determiner 213, the first writer 214 writes the write information corresponding to the fully received write request into the buffer memory 215. The write information includes at least the writing target data and the address information indicating the location in the nonvolatile memory 21 into which the writing target data is to be written. In this example, the first writer 214 writes the write request itself as the write information into the buffer memory 215, but the write information is not limited to the write request itself.

After writing the write information corresponding to the fully received write request (the write request itself, in this example) into the buffer memory 215, the first writer 214 notifies the write controller 216 of information indicating that the write information has been written into the buffer memory 215, in addition to information indicating the location in the buffer memory 215 into which the write information has been written (hereinafter, called "buffer location information" in some cases). After receiving this notification, the write controller 216 commands the second writer 217 to write the data based on the write request written in the location in the buffer memory 215 indicated by the buffer location information given by the first writer 214.

After receiving the write command from the write controller 216, the second writer 217 reads the write information written in the location in the buffer memory 215 indicated by the buffer location information (included in the write command, in this example) received from the write controller 216, and writes the data based on the read-out write information. As described above, the write information includes the address information indicating the location in the nonvolatile memory 21 into which the writing target data is to be written. In this example, the higher part of the address information serves as a row address indicating any one of the word lines, and the lower part of the address information serves as a column address indicating any one of the bit lines. The second writer 217 performs control in which data of one page (page data) corresponding to a word line indicated by the row address in the higher part of the address information included in the write information read from the buffer memory 215 is read out into the page buffer 202. Then, the second writer 217 controls the voltage supplied to the bit line indicated by the column address in the lower part of the address information so as to write the data (data corresponding to the writing target data included in the write request) to the page data in the page buffer 202. The second writer 217 writes the page data to which the data is written back to the memory cells connected to the word line indicated by the row address, and thus completes the writing into the nonvolatile memory 21.

In short, the controller 22 of the present embodiment further includes the buffer memory 215 for temporarily storing information, and the controller 22 stores writing target data included in the write request received from the memory controller 13 of the processor 10 in the buffer memory 215, and then, writes the data based on the writing target data stored in the buffer memory 215.

The description will be continued with reference to FIG. 3. The third determiner 218 determines whether the entire read request has been correctly received. The method of this determination is basically the same as the method of determining whether the entire write request has been correctly received. If the third determiner 218 determines that the read request has been received, the third determiner 218 commands the reader 219 to read the data corresponding to the received read request (fully received read request).

After receiving the read command from the third determiner 218, the reader 219 reads the data stored in the location in the nonvolatile memory 21 indicated by the address information included in the read request (included in the read command, in this example) received from the third determiner 218, and sends the read-out data as a response (reply) to the memory controller 13 of the processor 10.

Figure 4:
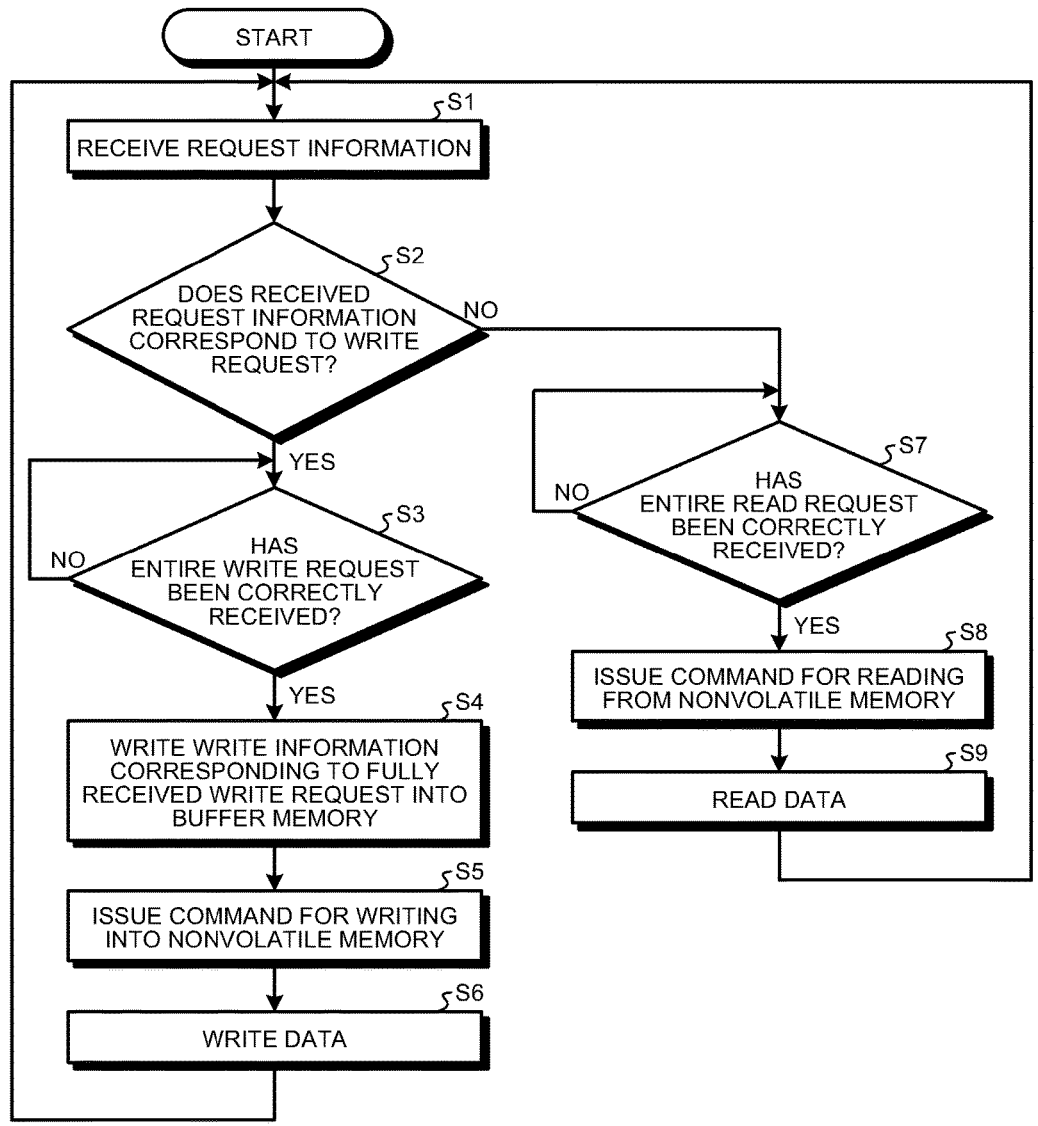
FIG. 4 is a diagram illustrating an operation example of a controller of the first embodiment.

FIG. 4 is a flowchart illustrating an operation example of the controller 22 when the request information has been received from the memory controller 13 of the processor 10. First, the receiver 211 receives the request information (Step S1). Then, the first determiner 212 determines whether the request information received at Step S1 corresponds to a write request (Step S2).

If the request information received at Step S1 described above corresponds to a write request (Yes at Step S2), the second determiner 213 determines whether the entire write request has been correctly received (Step S3). If the entire write request has been correctly received (Yes at Step S3), the second determiner 213 commands the first writer 214 to write the write information corresponding to the received write request into the buffer memory 215. After being commanded by the second determiner 213, the first writer 214 writes the write information corresponding to the fully received write request into the buffer memory 215 (Step S4). After writing the write information corresponding to the fully received write request into the buffer memory 215, the first writer 214 notifies the write controller 216 of the information indicating that the write information has been written into the buffer memory 215, in addition to the buffer location information. After receiving this notification, the write controller 216 commands the second writer 217 to write the data based on the write information written in the location in the buffer memory 215 indicated by the buffer location information given by the first writer 214 (Step S5). After receiving the write command from the write controller 216, the second writer 217 writes the data into the nonvolatile memory 21 (Step S6).

Figure 5:
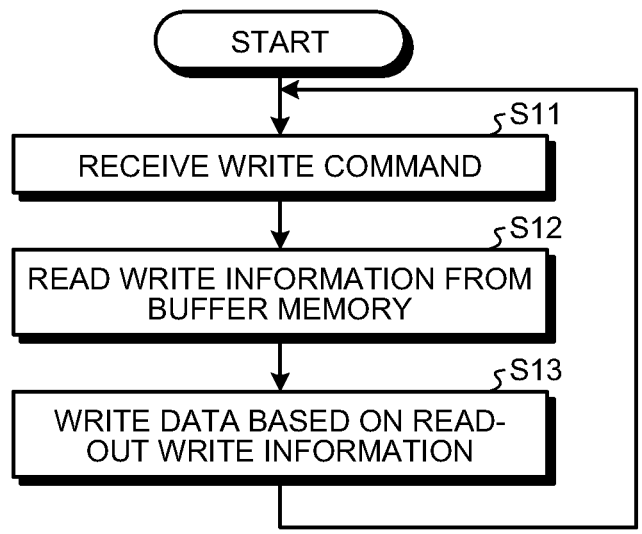
FIG. 5 is a diagram illustrating another operation example of the controller of the first embodiment.

FIG. 5 is a flowchart illustrating an example of the detailed operation at Step S6. As illustrated in FIG. 5, the second writer 217 first receives the write command from the write controller 216 (Step S11). The second writer 217 then reads the write information written in the location in the buffer memory 215 indicated by the buffer location information (included in the write command, in this example) received from the write controller 216 (Step S12). The second writer 217 then write the data based on the write information read at Step S12 (Step S13).

The description will be continued referring back to FIG. 4. If, at Step S2 described above, the request information received at Step S1 does not correspond to a write request (No at Step S2), in other words, if the request information received at Step S1 corresponds to a read request, the third determiner 218 determines whether the entire read request has been correctly received (Step S7). If the entire read request has been correctly received (Yes at Step S7), the third determiner 218 commands the reader 219 to read the data corresponding to the received read request (Step S8). After receiving the read command from the third determiner 218, the reader 219 reads the data from the nonvolatile memory 21 (Step S9). More specifically, the reader 219 reads the data stored in the location in the nonvolatile memory 21 indicated by the address information included in the read request (included in the read command, in this example) received from the third determiner 218, and sends the read-out data as a response (reply) to the memory controller 13 of the processor 10.

Figure 6:
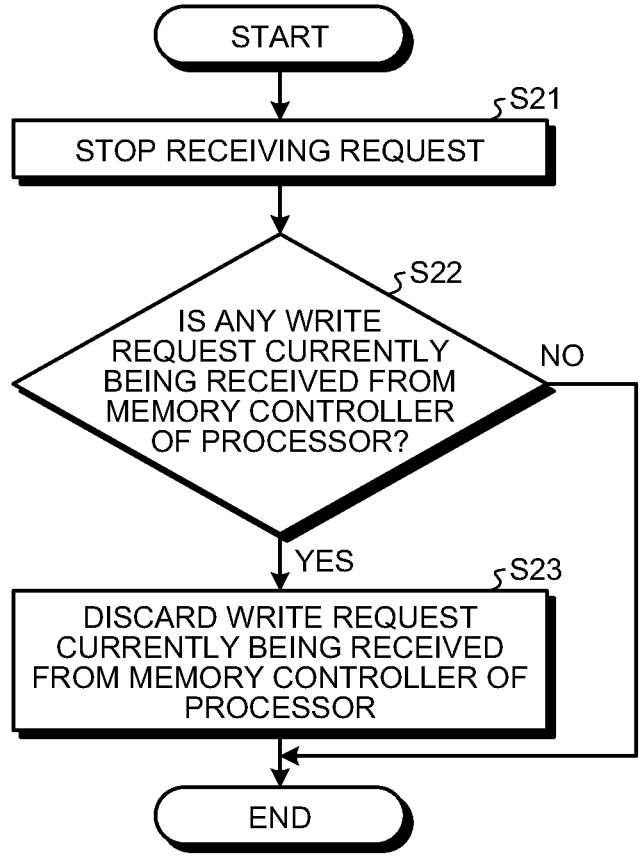
FIG. 6 is a diagram illustrating still another operation example of the controller of the first embodiment.

The following describes, using FIG. 6, an operation example of the controller 22 when the controller 22 (detector 210) has detected the abnormality in the power supplied from the power supply 30 to the memory device 20. The flowchart of FIG. 6 assumes that the voltage of the power supplied from the power supply 30 to the memory device 20 has dropped to or below the threshold, and, as a result, the detector 210 has detected that the abnormality in the power has occurred and has notified each of the receiver 211 and the second determiner 213 that the abnormality has occurred. Because the voltage of the power supplied from the power supply 30 to the memory device 20 has dropped to or below the threshold, the state of the power of the memory device 20 has been switched to the state in which the power stored in the power storage 23 is supplied to each of the nonvolatile memory 21 and the controller 22.

After receiving the notification of the abnormality occurrence from the detector 210, the receiver 211 stops receiving the subsequent request (request information) (Step S21). Also, after receiving the notification of the abnormality occurrence from the detector 210, the second determiner 213 determines whether any write request is currently being received from the memory controller 13 of the processor 10 (Step S22). If any write request is currently being received from the memory controller 13 of the processor 10 (Yes at Step S22), the second determiner 213 discards the write request currently being received (Step S23).

If, instead, the write request has already been fully received when the detector 210 detects the abnormality, the power supplied from the power storage 23 is used to write the data based on the already fully received write request. If the power storage 23 is constituted by a capacitor as in the present embodiment, the capacity of the capacitor is set to a value that allows the capacitor to store the amount of power required for at least writing the data based on the already received write request when the abnormality has occurred in the power supplied from the power supply 30 to the memory device 20. The capacity of the capacitor may be set, for example, to a value that allows the capacitor to store an amount of power allowing processing of all write requests that can be held in the buffer memory 215.

As described above, if the abnormality in the power supplied from the power supply 30 to the memory device 20 is detected, the controller 22 of the memory device 20 uses the power supplied from the power storage 23 to write the data based on the already received write request. That is, if the abnormality occurs in the power supplied from the power supply 30 to the memory device 20, the power supplied from the power storage 23 can be used to complete the writing based on the already fully received write request. As a result, according to the present embodiment, the atomicity can also be ensured with the configuration in which the memory device 20 is provided with the controller 22.

First Modification of First Embodiment

The memory device 20 may have, for example, a configuration including a plurality of access ports.

Figure 7:
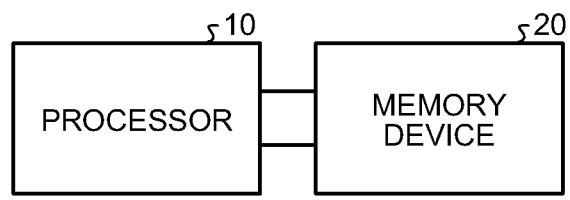
FIG. 7 is a diagram illustrating a connection example of the memory device and a processor according to a modification of the first embodiment.

For example, connecting the memory device 20 to the processor 10 via a plurality of access ports can increase the data transfer capacity. For example, the memory device 20 may include two access ports, as illustrated in FIG. 7. The bandwidth of the data transfer can be doubled by connecting the memory device 20 to the processor 10 using the two access ports in this way.

Figure 8:
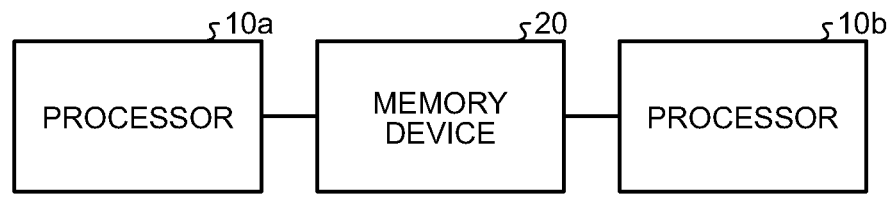
FIG. 8 is a diagram illustrating a connection example of the memory device and processors of the modification.

Alternatively, for example, the memory device 20 can be connected to a plurality of processors 10. For example, as illustrated in FIG. 8, two processors 10a and 10b can be connected to the memory device 20 having two access ports. This example allows the processors 10a and 10b to share data with each other.

The configuration may, for example, be such that the memory device 20 is connected to the processor 10 and another memory device (hereinafter, called a "second memory device 200"), and forwards the write request from the processor 10 to the second memory device 200 as needed. The configuration may be such that the memory device 20 is connected to the second memory device 200 as illustrated in FIG. 9, and, if the controller 22 of the memory device 20 receives, from the memory controller 13 of the processor 10, a second write request requesting writing of data into the second memory device 200, the controller 22 forwards the second write request to the second memory device 200.

Figure 9:
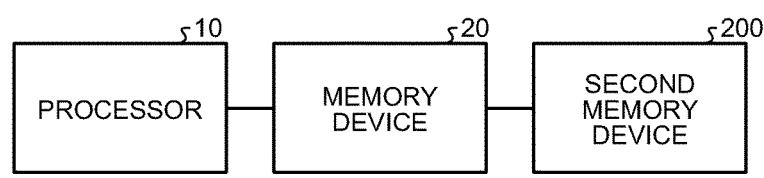
FIG. 9 is a diagram illustrating a connection example of memory devices and the processor of the modification.

In the case of the cascade connection as illustrated in FIG. 9, the processor 10 recognizes that the writing is completed when the write request has been fully transmitted to the memory device 20 directly connected to the processor 10. Hence, the memory device 20 that has received the second write request to be forwarded to the second memory device 200 forwards the second write request to the second memory device 200 using the power from the power storage 23 even if the abnormality occurs in the power supplied from the power supply 30 to the memory device 20.

That is, in the example of FIG. 9, if the abnormality in the power supplied from the power supply 30 to the memory device 20 is detected, the controller 22 of the memory device 20 uses the power supplied from the power storage 23 to forward the already received second write request to the second memory device 200.

Figure 10:
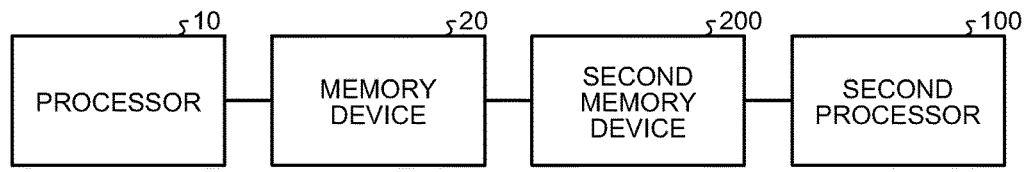
FIG. 10 is a diagram illustrating a connection example of the memory devices and processors of the modification.
Figure 11:
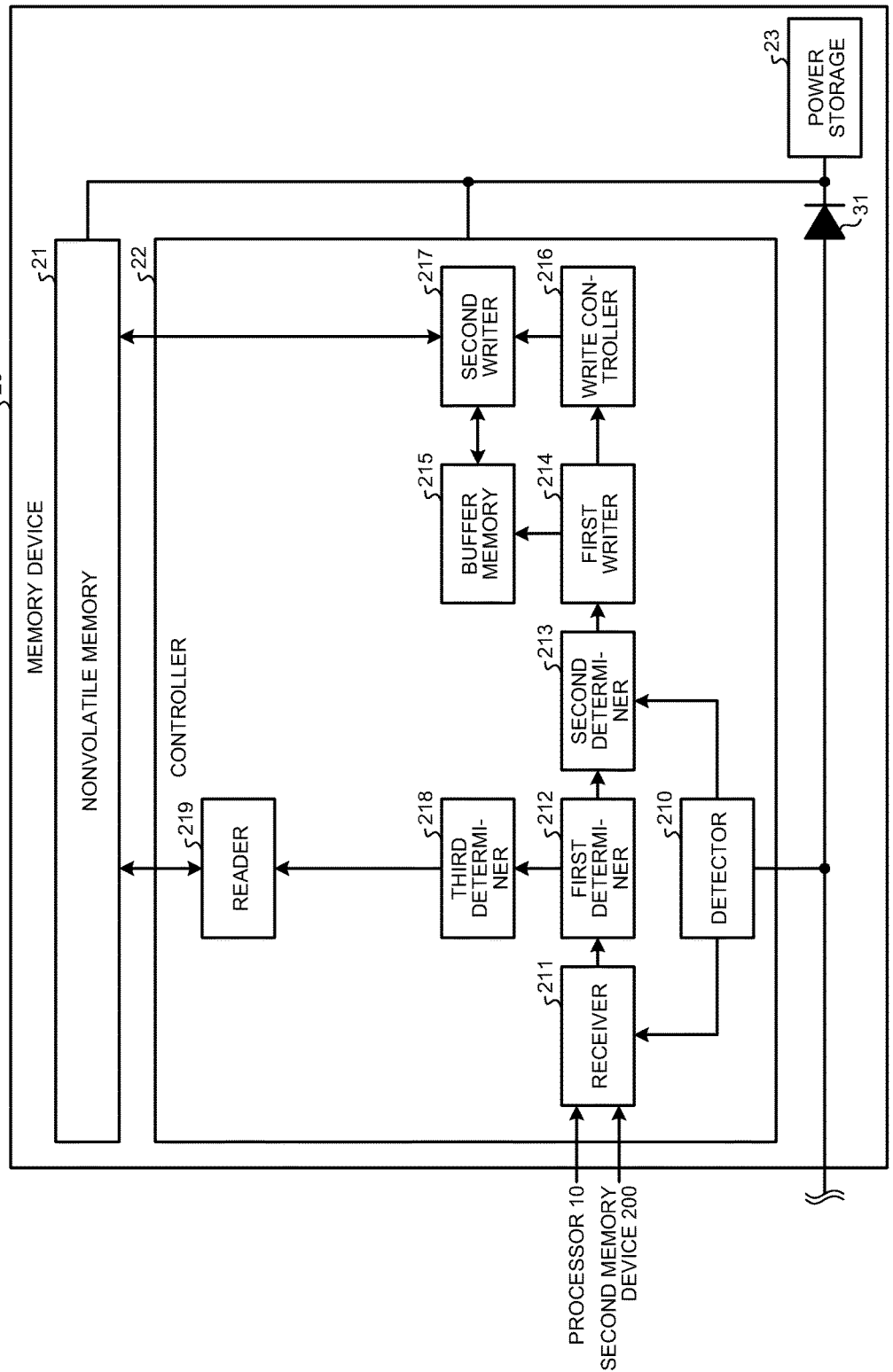
FIG. 11 is a diagram illustrating an example of the detailed configuration of the memory device of the modification.

The configuration can, for example, be such that the second memory device 200 is connected to a second processor 100 (an example of a second host device) other than the processor 10, as illustrated in FIG. 10. The basic configuration of the second processor 100 is the same as the configuration of the processor 10. In this example, the controller 22 of the memory device 20 receives, from the second memory device 200, a third write request through which the second processor 100 requests writing of data into the nonvolatile memory 21, and then, writes the data based on the third write request. The controller 22 receives, from the second memory device 200, a second read request through which the second processor 100 requests reading of data from the nonvolatile memory 21, and then, reads the data corresponding to the second read request. In this example, as illustrated in FIG. 11, the memory device 20 includes two access ports (an access port for the processor 10 and an access port for the second memory device 200). In the example of FIG. 11, the memory device 20 can accept requests from both the processor 10 and the second memory device 200.

The configuration of FIGS. 10 and 11 complicates the operation of the memory device 20 when the abnormality in the power supplied from the power supply 30 to the memory device 20 is detected. That is explained as follows: after detecting the abnormality in the power, the memory device 20 stops receiving the write request from the processor 10; then, if the request already received at that moment is a write request requesting writing of data into the memory device 20, the memory device 20 needs to write the data based on the write request; or, if the request is a write request (second write request) requesting writing of data into the other memory device (second memory device 200), the memory device 20 needs to surely complete forwarding the request to the other memory device. In addition, if the memory device 20 detects the abnormality in the power, the memory device 20 needs to stop receiving the request from the processor 10 directly connected to the memory device 20. However, if a request (the third write request or the second read request, in this example) already received at that moment by the other memory device (second memory device 200, in this example) from the other processor (second processor 100, in this example) is forwarded to the memory device 20, the memory device 20 needs to surely receive the request.

Accordingly, in this example, if any third write request is currently being received from the second memory device 200 when the abnormality in the power supplied from the power supply 30 to the memory device 20 is detected, the controller 22 of the memory device 20 uses the power supplied from the power storage 23 to continue receiving the third write request from the second memory device 200. The controller 22 then uses the power supplied from the power storage 23 to write the data based on the third write request that has been fully received.

Figure 12:
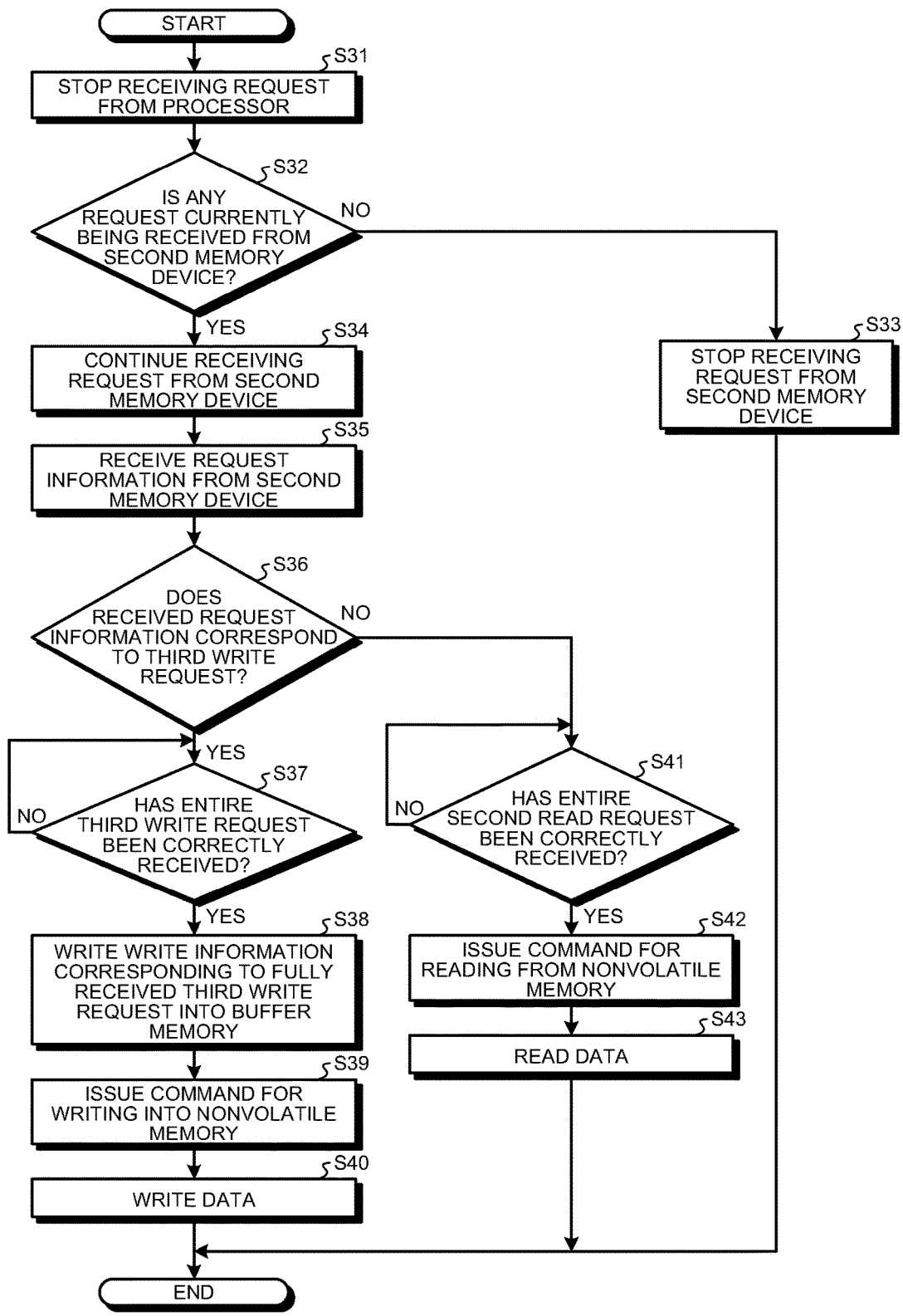
FIG. 12 is a diagram illustrating an operation example of the controller of the modification.

FIG. 12 is a flowchart illustrating an operation example of the controller 22 when the controller 22 (detector 210) in the configuration of FIGS. 10 and 11 has detected the abnormality in the power supplied from the power supply 30 to the memory device 20. The flowchart of FIG. 12 assumes that the voltage of the power supplied from the power supply 30 to the memory device 20 has dropped to or below the threshold, and, as a result, the detector 210 has detected that the abnormality in the power has occurred. Because the voltage of the power supplied from the power supply 30 to the memory device 20 has dropped to or below the threshold, the state of the power of the memory device 20 has been switched to the state in which the power stored in the power storage 23 is supplied to each of the nonvolatile memory 21 and the controller 22.

First, the detector 210 commands the receiver 211 to stop receiving the request from the processor 10. After receiving the command, the receiver 211 stops receiving the subsequent request from the processor 10 (Step S31). The detector 210 then queries the second determiner 213 to determine whether any request is currently being received from the second memory device 200 (Step S32). Various methods can be considered to determine whether the request received by the receiver 211 is a request transmitted from the processor 10 or a request forwarded from the second memory device 200. For example, when the memory device 20 is initialized, a setting is made as to whether each of the access ports is connected to the processor 10 or the second memory device 200, and the determination can be made as to whether the received request is the request from the processor 10 or the request from the second memory device 200, according to which of the access ports has received the request. The configuration may, for example, be such that the request includes flag information indicating whether the processor 10 has transmitted the request, or the second memory device 200 has forwarded the request.

If no request is currently being received from the second memory device 200 (No at Step S32), the detector 210 commands the receiver 211 to stop receiving the request from the second memory device 200. After receiving the command, the receiver 211 stops receiving the subsequent request from the processor 10 (Step S33).

If, instead, any request is currently being received from the second memory device 200 (Yes at Step S32), the detector 210 commands the receiver 211 to continue receiving the request from the second memory device 200. After receiving the command, the receiver 211 continues receiving the request from the second memory device 200 (Step S34). After the receiver 211 receives the request information (information constituting the request) from the second memory device 200 (Step S35), the first determiner 212 determines whether the request information received at Step S1 corresponds to the third write request (Step S36). The method of this determination is the same as the method described above in the first embodiment. Processing details of subsequent Steps S37 to S43 are the same as the processing details of Steps S3 to S9 of FIG. 4, so that detailed description thereof will not be made. If, at Step S37 of FIG. 12, the entire third write request is determined to have been correctly received (Yes at Step S37), or if, at Step S41 of FIG. 12, the entire second read request is determined to have been correctly received (Yes at Step S41), the subsequent request (request information) from the second memory device 200 may stop being received.

Figure 13:
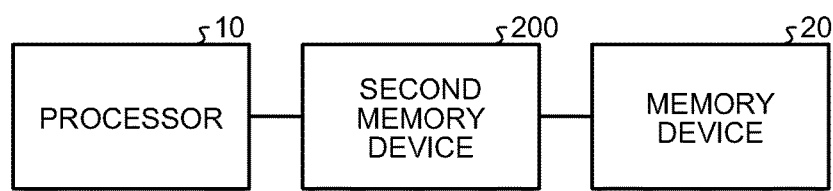
FIG. 13 is a diagram illustrating a connection example of the memory devices and the processor of the modification.

The same problem as the above described problem lies, for example, in a configuration in which the memory device 20 is not directly connected to the processor 10, and receives the request (the write request or the read request) from the processor 10 via the second memory device 200, as illustrated in FIG. 13. That is, if, when the abnormality in the power is detected, the request (the write request or the read request) to the memory device 20 is forwarded that has already been received by the second memory device 200 from the processor 10, the memory device 20 needs to surely receive the request.

With the configuration of FIG. 13, the controller 22 of the memory device 20 receives, from the second memory device 200 connected to the memory device 20, the write request through which the processor 10 (an example of the host device) requests the writing of the data into the nonvolatile memory 21, and then, writes the data based on the write request. If the abnormality in the power supplied from the power supply 30 to the memory device 20 is detected, the controller 22 uses the power supplied from the power storage 23 to write the data based on the already received write request, and, if any write request is currently being received from the second memory device 200, the controller 22 uses the power supplied from the power storage 23 to continue receiving the write request from the second memory device 200.

In the above-described way, even in the case of using a combination of a plurality of memory devices, when one or more processors connected to any of the memory devices transmits (or transmit) a write request (or write requests) (including the second write request and the third write request described above) to any of the memory devices before the abnormality in the power occurs, the write request (or write requests) can be guaranteed to be forwarded to a target memory device (or target memory devices) without fail, and the data based on the write request (or write requests) can be guaranteed to be written.

Second Modification of First Embodiment

Figure 14:
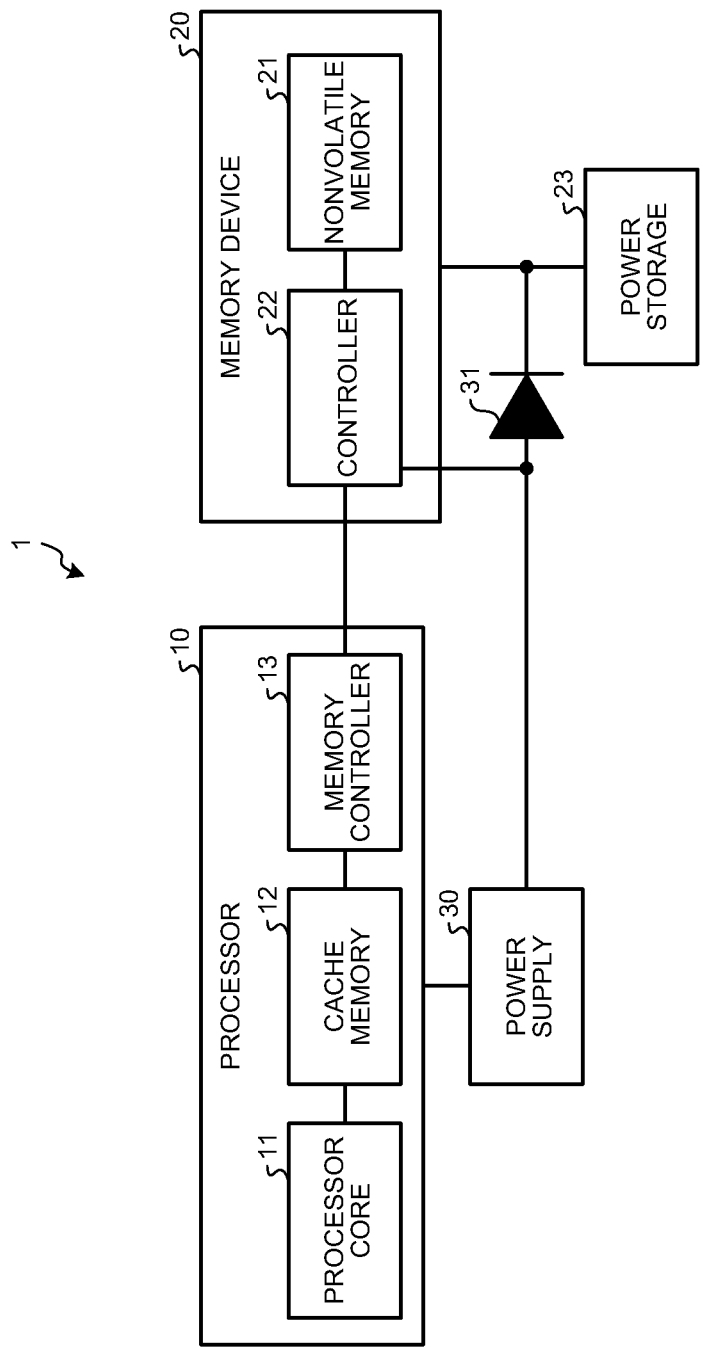
FIG. 14 is a diagram illustrating an example of the configuration of the memory device according to another modification of the first embodiment.

The configuration may, for example, be such that the power storage 23 and the rectifying device 31 are provided outside the memory device 20, as illustrated in FIG. 14. In short, the configuration may be such that the memory device 20 includes the above-described nonvolatile memory 21 and the above-described controller 22, and, if the abnormality in the power supplied from the power supply 30 to the memory device 20 is detected, the above-described controller 22 writes the data based on the already received write request, using the power supplied from the power storage 23 for storing the power supplied from the power supply 30. From another point of view, the configuration may be such that the semiconductor device includes the above-described nonvolatile memory 21 and the above-described controller 22, and, if the abnormality in the power supplied from the power supply 30 to the semiconductor device is detected, the controller 22 writes the data based on the already received write request, using the power supplied from the power storage 23 for storing the power supplied from the power supply 30. The configuration may also be such that the information processing device 1 includes the above-described processor 10, the above-described nonvolatile memory 21, and the above-described controller 22, and, if the abnormality in the power supplied from the power supply 30 to the information processing device 1 is detected, the controller 22 writes the data based on the already received write request, using the power supplied from the power storage 23 for storing the power supplied from the power supply 30.

In the example of FIG. 14, the configuration can be considered to be such that the memory device 20 includes the above-described nonvolatile memory 21 and the above-described controller 22, and, if the voltage of the power supplied from the power supply 30 to the memory device 20 drops to or below the threshold, the above-described controller 22 writes the data based on the already received write request, using the power supplied from the power storage 23 for storing the power supplied from the power supply 30. From another point of view, the configuration can be considered to be such that the semiconductor device includes the above-described nonvolatile memory 21 and the above-described controller 22, and, if the voltage of the power supplied from the power supply 30 to the semiconductor device drops to or below the threshold, the controller 22 writes the data based on the already received write request, using the power supplied from the power storage 23 for storing the power supplied from the power supply 30. The configuration can also be considered to be such that the information processing device 1 includes the above-described processor 10, the above-described nonvolatile memory 21, and the above-described controller 22, and, if the voltage of the power supplied from the power supply 30 to the information processing device 1 drops to or below the threshold, the controller 22 writes the data based on the already received write request, using the power supplied from the power storage 23 for storing the power supplied from the power supply 30.

Third Modification of First Embodiment

Figure 15:
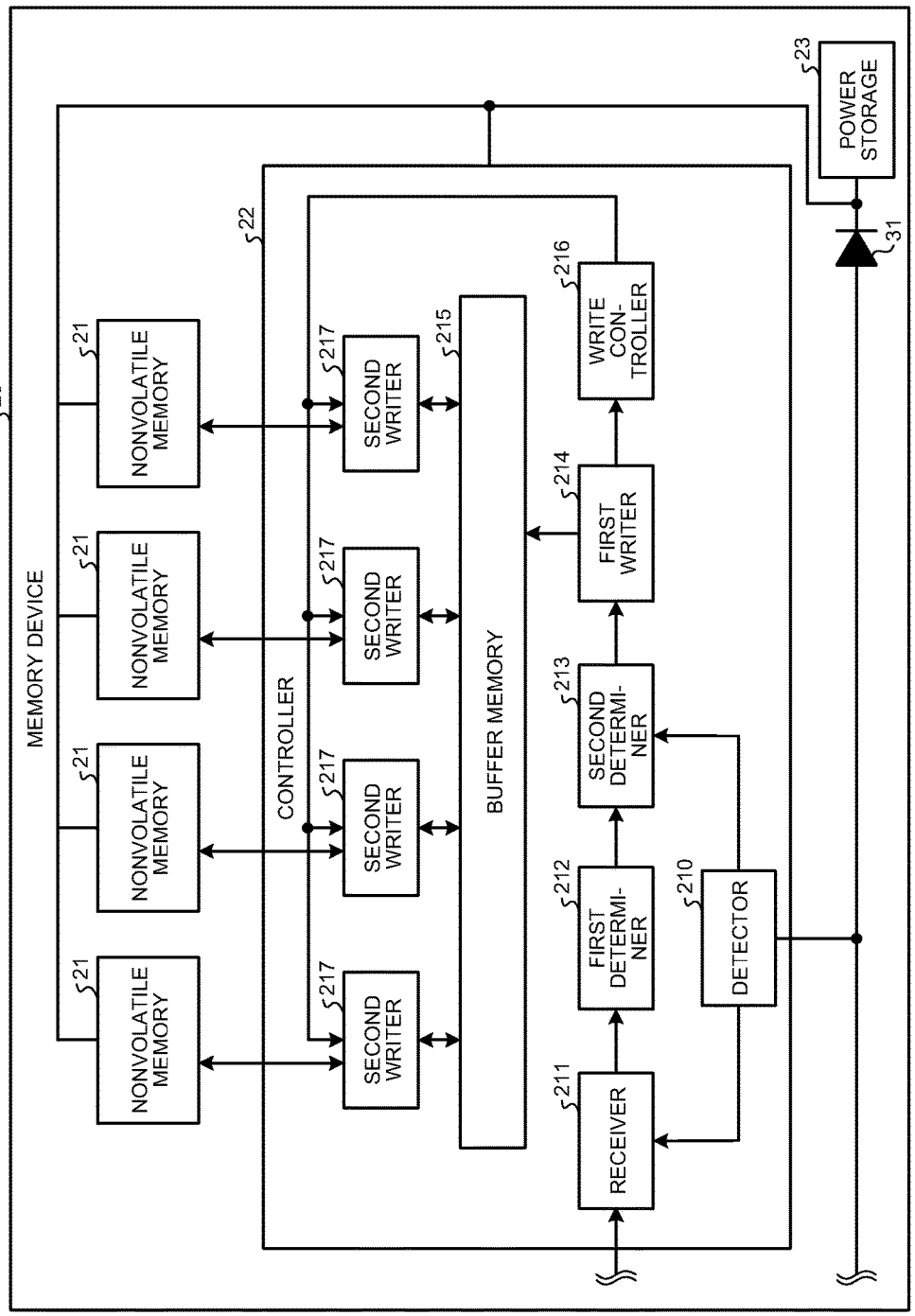
FIG. 15 is a diagram illustrating an example of the detailed configuration of the memory device according to still another modification of the first embodiment.

A case can be considered in which the memory device 20 includes therein a plurality of dies or chips of the nonvolatile memories 21, as in the case of, for example, an HMC memory device. Hence, the configuration may be such that the memory device 20 includes a plurality of the nonvolatile memories 21, as illustrated in FIG. 15. Although the example of FIG. 15 does not illustrate the third determiner 218 and the reader 219 for convenience of layout, the configuration is the same as that of the first embodiment described above, except in that a plurality of the nonvolatile memories 21 are provided, and a plurality of the second writers 217 are provided corresponding to the nonvolatile memories 21 on a one-to-one basis.

For example, after writing the write information corresponding to the fully received write request (the write request itself, in this example) into the buffer memory 215, the first writer 214 can notify the write controller 216 of information indicating that the write information has been written into the buffer memory 215, in addition to the buffer location information indicating the location in the buffer memory 215 into which the write information has been written and nonvolatile memory information indicating one of the nonvolatile memories 21 corresponding to the write request (one of the nonvolatile memories 21 identified by the address information included in the write request). After receiving this notification, the write controller 216 can command one of the second writers 217 corresponding to the nonvolatile memory 21 indicated by the nonvolatile memory information given by the first writer 214 to write the data based on the write information written in the location in the buffer memory 215 indicated by the buffer location information given by the first writer 214.

Moreover, instead of being provided with the common buffer memory 215, the memory device 20 may be provided with a plurality of the buffer memories 215 corresponding to the nonvolatile memories 21 on a one-to-one basis (corresponding to the second writers 217 on a one-to-one basis, from another point of view). With this configuration, the first writer 214 may write the write information corresponding to the fully received write request (the write request itself, in this example) into one of the buffer memories 215 corresponding to one of the nonvolatile memories 21 identified by the address information included in the write request, and may then notify corresponding one of the write controllers 216 of information indicating that the write information has been written into the buffer memory 215, in addition to the buffer location information indicating the location in the buffer memory 215 into which the write information has been written.

The number of the access ports included in the memory device 20 illustrated in FIG. 15 may be one or two or more, or may be set to any value.

Figure 16:
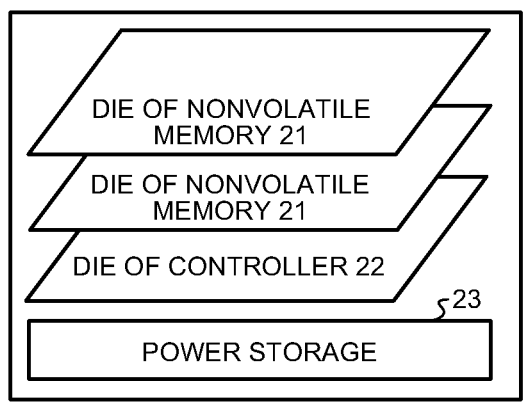
FIG. 16 is a schematic diagram illustrating an example of a packaging method of the memory device of the modification.
Figure 17:
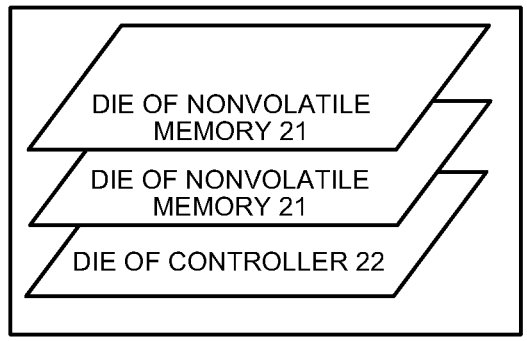
FIG. 17 is a schematic diagram illustrating another example of the packaging method of the memory device of the modification.

FIG. 16 is a schematic diagram illustrating an example of a packaging method of the memory device 20 of the present modification. This packaging method is a method in which a plurality of silicon dies of the nonvolatile memories 21 and a silicon die of the controller 22 are connected using a technology, such as a TSV technology, and sealed in a package, as in the case of the HMC memory device. A modification of this packaging method may be used in which the silicon dies of the nonvolatile memories 21 and the silicon die of the controller 22 are connected on a silicon interposer to be formed as the 2.5D-packaged memory device 20. While the example of FIG. 16 illustrates a configuration in which the memory device 20 incorporates the power storage 23, the power storage 23 may be provided external to the memory device 20, as illustrated in FIG. 17.

Figure 18:
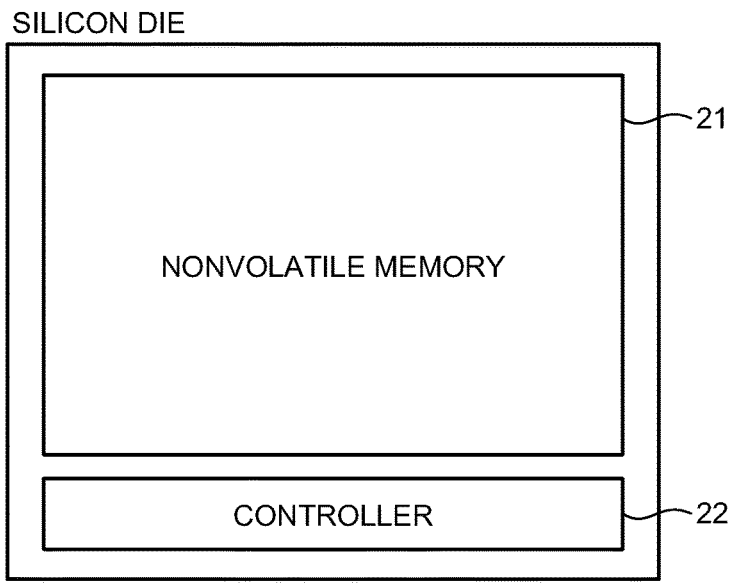
FIG. 18 is a schematic diagram illustrating still another example of the packaging method of the memory device of the modification.
Figure 19:
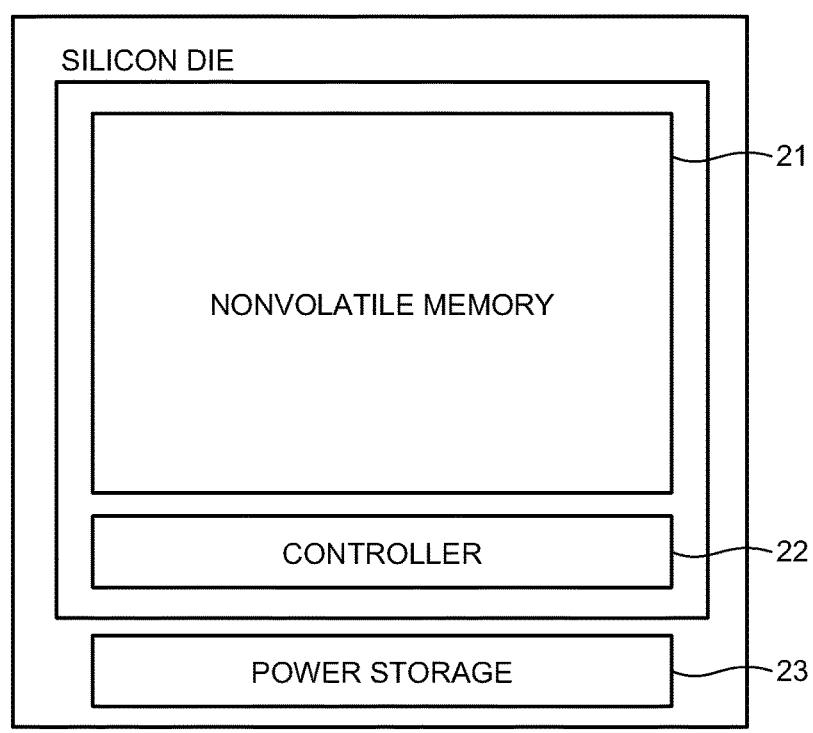
FIG. 19 is a schematic diagram illustrating still another example of the packaging method of the memory device of the modification.

FIG. 18 is a schematic diagram illustrating still another example of the packaging method of the memory device 20. This packaging method is a method in which the controller 22 and the nonvolatile memories 21 (the number of the nonvolatile memories 21 may be plural, as in the present modification, or one, as in the first embodiment described above) are integrated in one silicon die, and the silicon die is sealed in one package. The silicon die of FIG. 18 can be housed alone in the package to be put into operation as the memory device 20, or the silicon die and the power storage 23 can be housed in the package to be put into operation as the memory device 20, as illustrated in FIG. 19.

The packaging method of the memory device 20 is not limited to the above-described examples, but various packaging methods can be used. The packaging method of the memory device 20 can employ, for example, a method in which one or more chips of the nonvolatile memories 21 and a chip of the controller 22 are mounted on a printed circuit board.

Second Embodiment

Figure 20:
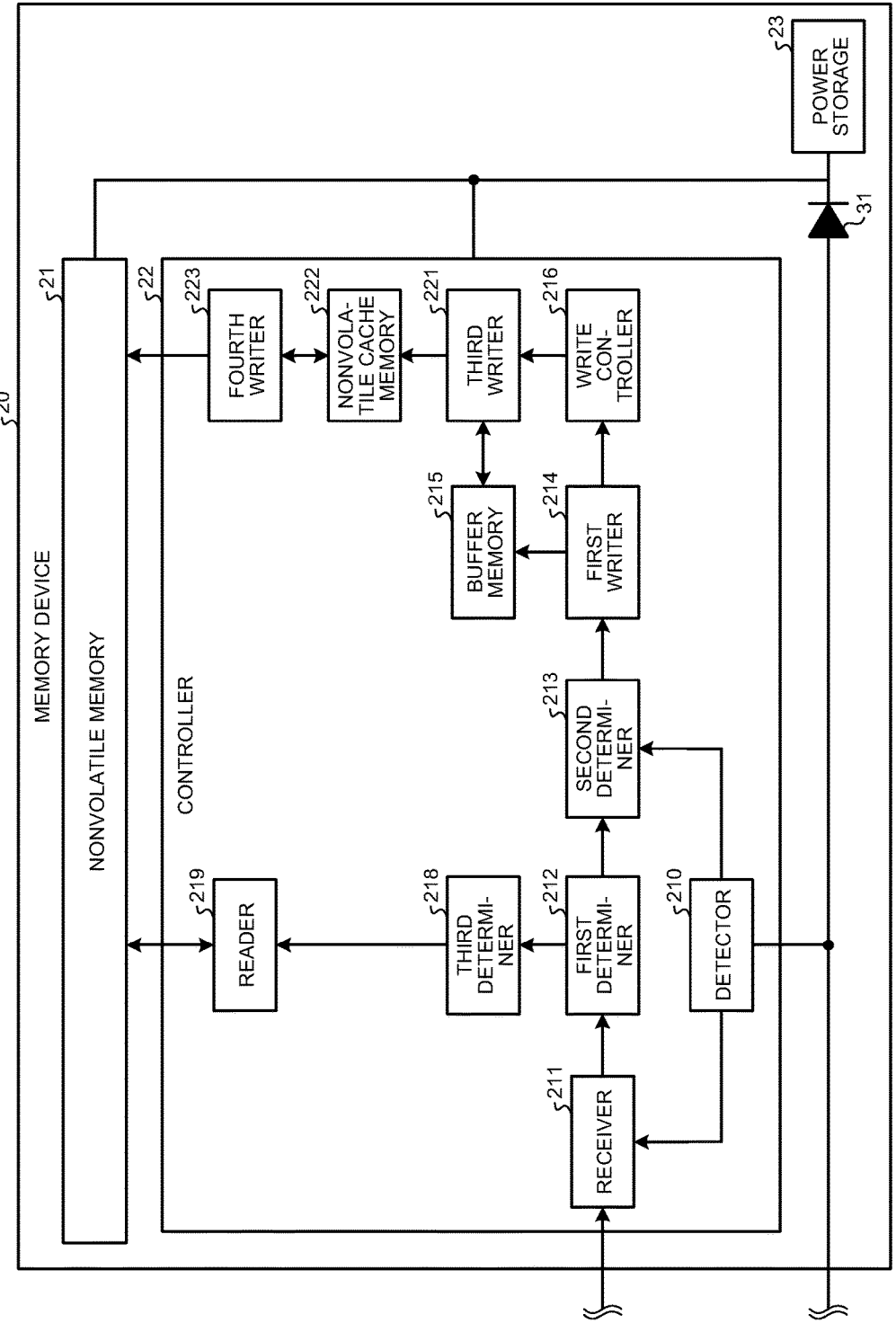
FIG. 20 is a diagram illustrating an example of the detailed configuration of the memory device according to a second embodiment.

The following describes a second embodiment. Description will be omitted for parts common to those in the first embodiment described above, where appropriate. FIG. 20 is a diagram illustrating an example of the detailed hardware configuration of the memory device 20 of the present embodiment. As illustrated in FIG. 20, the controller 22 differs from that of the first embodiment described above in further including a nonvolatile cache memory 222, and in including a third writer 221 and a fourth writer 223, instead of the second writer 217 described above.

The write request received by the controller 22 becomes permanent when written, not into the nonvolatile memory 21, but into the higher-speed nonvolatile cache memory 222. In the present embodiment, if the second determiner 213 determines that the entire write request has been correctly received, the second determiner 213 commands the first writer 214 to write the write information corresponding to the received write request (in this example, the write request itself, but not limited thereto) into the buffer memory 215.

After being commanded by the second determiner 213, the first writer 214 writes the write information corresponding to the fully received write request into the buffer memory 215. After writing the write information corresponding to the fully received write request into the buffer memory 215, the first writer 214 notifies the write controller 216 of information indicating that the write information has been written into the buffer memory 215, in addition to the buffer location information indicating the location in the buffer memory 215 into which the write information has been written.

After receiving the notification from the first writer 214, the write controller 216 commands the third writer 221 to write the write information written in the location in the buffer memory 215 indicated by the buffer location information given by the first writer 214 into the nonvolatile cache memory 222.

After receiving the write command from the write controller 216, the third writer 221 reads the write information written in the location in the buffer memory 215 indicated by the buffer location information (included in the write command, in this example) received from the write controller 216. The third writer 221 then writes the read-out write information (the write request itself, in this example) into the nonvolatile cache memory 222.

The fourth writer 223 writes the data based on the write information written in the nonvolatile cache memory 222 (into the nonvolatile memory 21) at an appropriate time.

In the same way as in the first embodiment described above, after receiving the notification of the abnormality occurrence from the detector 210, the receiver 211 stops receiving the subsequent request. Also, after receiving the notification of the abnormality occurrence from the detector 210, the second determiner 213 determines whether any write request is currently being received from the memory controller 13 of the processor 10. If any write request is currently being received from the memory controller 13 of the processor 10, discards the write request currently being received. If, instead, the write request has already been fully received when the detector 210 detects the abnormality, the power supplied from the power storage 23 is used to write the write information corresponding to the already fully received write request into the nonvolatile cache memory 222.

The above is summarized as follows: the memory device 20 of the present embodiment includes the above-described nonvolatile cache memory 222, the controller 22, and the power storage 23 for storing the power supplied from the power supply 30, where the controller 22 receives, from the memory controller 13 of the processor 10, the write request requesting the writing of the data into the nonvolatile memory 21, and then writes the write information corresponding to the write request into the nonvolatile cache memory; and, if the abnormality in the power supplied from the power supply 30 to the memory device 20 is detected, the controller 22 uses the power supplied from the power storage 23 to write the write information corresponding to the already received write request into the nonvolatile cache memory 222. From another point of view, the configuration can be considered to be such that the semiconductor device includes the above-described nonvolatile cache memory 222, the above-described controller 22, and the power storage 23 for storing the power supplied from the power supply 30, and, if the abnormality in the power supplied from the power supply 30 to the "semiconductor device" is detected, the controller 22 uses the power supplied from the power storage 23 to write the write information corresponding to the already received write request into the nonvolatile cache memory 222. The configuration can also be considered to be such that the information processing device 1 includes the above-described processor 10, the above-described nonvolatile cache memory 222, the above-described controller 22, and the power storage 23 for storing the power supplied from the power supply 30, and, if the abnormality in the power supplied from the power supply 30 to the "information processing device 1" is detected, the controller 22 uses the power supplied from the power storage 23 to write the write information corresponding to the already received write request into the nonvolatile cache memory 222.

The configuration can also be considered to be such that the memory device 20 of the present embodiment includes the above-described nonvolatile cache memory 222, the above-described controller 22, and the power storage 23 for storing the power supplied from the power supply 30, and, if the voltage of the power supplied from the power supply 30 to the memory device 20 drops to or below the threshold, the controller 22 uses the power supplied from the power storage 23 to write the write information corresponding to the already received write request into the nonvolatile cache memory 222. From another point of view, the configuration can be considered to be such that the semiconductor device includes the above-described nonvolatile cache memory 222, the above-described controller 22, and the power storage 23 for storing the power supplied from the power supply 30, and, if the voltage of the power supplied from the power supply 30 to the "semiconductor device" drops to or below the threshold, the controller 22 uses the power supplied from the power storage 23 to write the write information corresponding to the already received write request into the nonvolatile cache memory 222. The configuration can also be considered to be such that the information processing device 1 includes the above-described processor 10, the above-described nonvolatile cache memory 222, the above-described controller 22, and the power storage 23 for storing the power supplied from the power supply 30, and, if the voltage of the power supplied from the power supply 30 to the "information processing device 1" drops to or below the threshold, the controller 22 uses the power supplied from the power storage 23 to write the write information corresponding to the already received write request into the nonvolatile cache memory 222.

Also in the present embodiment, if the abnormality in the power supplied from the power supply 30 to the memory device 20 is detected, the controller 22 of the memory device 20 uses the power supplied from the power storage 23 to write the write information corresponding to the already received write request into the nonvolatile cache memory 222. That is, even if the abnormality occurs in the power supplied from the power supply 30 to the memory device 20, the power supplied from the power storage 23 can be used to complete writing the write information corresponding to the already fully received write request to the nonvolatile cache memory 222, so that the atomicity can be ensured.

Modification of Second Embodiment

Figure 21:
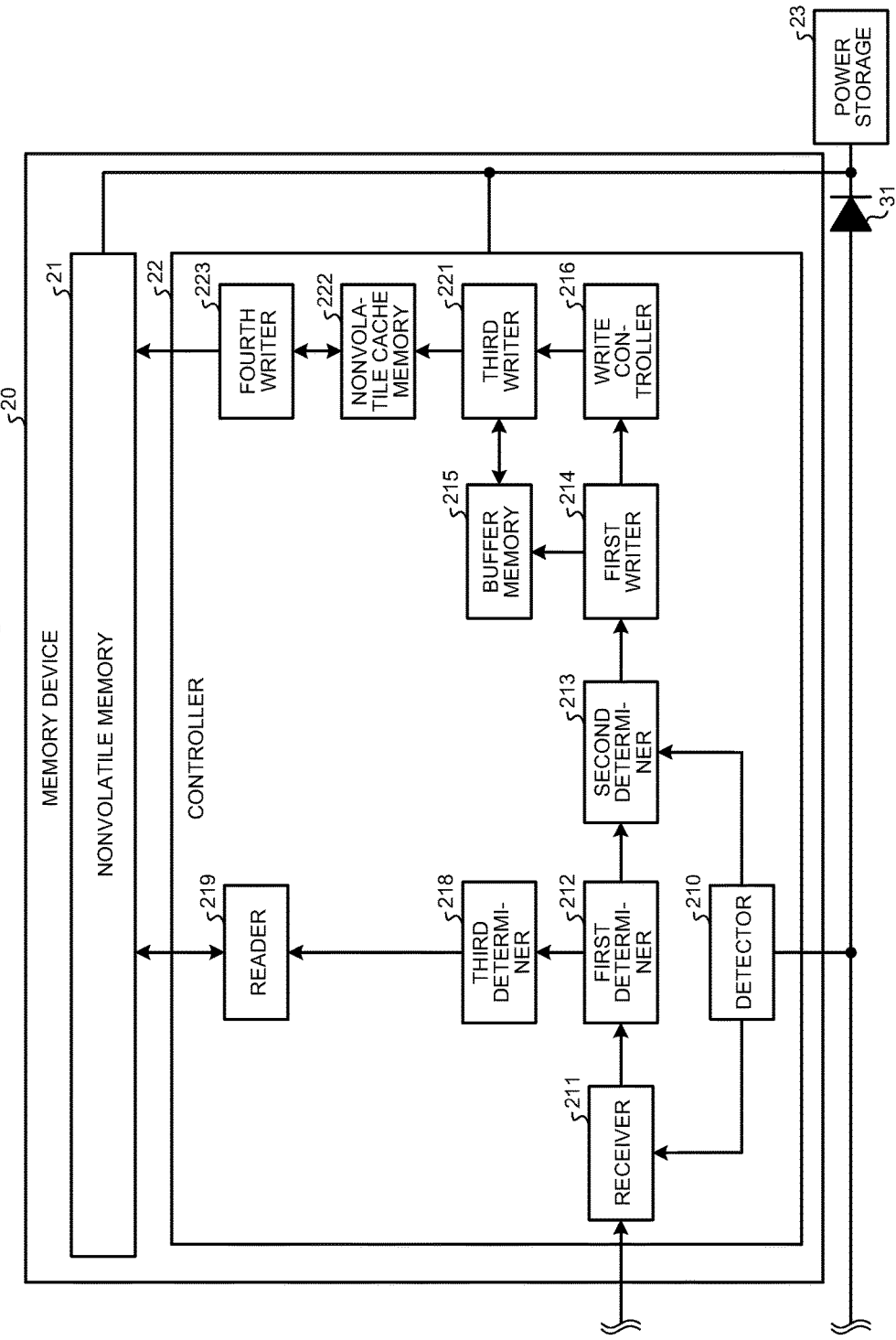
FIG. 21 is a diagram illustrating an example of the configuration of the memory device according to a modification of the second embodiment.

The configuration may, for example, be such that the power storage 23 and the rectifying device 31 are provided outside the memory device 20, as illustrated in FIG. 21. In short, the configuration may be such that the memory device 20 includes the above-described nonvolatile cache memory 222 and the above-described controller 22, and, if the abnormality in the power supplied from the power supply 30 to the memory device 20 is detected, the controller 22 writes the write information corresponding to the already received write request into the nonvolatile cache memory 222, using the power supplied from the power storage 23 for storing the power supplied from the power supply 30. From another point of view, the configuration may be such that the semiconductor device includes the above-described nonvolatile memory 21 and the above-described controller 22, and, if the abnormality in the power supplied from the power supply 30 to the "semiconductor device" is detected, the controller 22 writes the write information corresponding to the already received write request into the nonvolatile cache memory 222, using the power supplied from the power storage 23 for storing the power supplied from the power supply 30. The configuration may also be such that the information processing device 1 includes the above-described nonvolatile memory 21 and the above-described controller 22, and, if the abnormality in the power supplied from the power supply 30 to the "information processing device 1" is detected, the controller 22 writes the write information corresponding to the already received write request into the nonvolatile cache memory 222, using the power supplied from the power storage 23 for storing the power supplied from the power supply 30.

In the example of FIG. 21, the configuration can also be considered to be such that the memory device 20 includes the above-described nonvolatile memory 21 and the above-described controller 22, and, if the voltage of the power supplied from the power supply 30 to the memory device 20 drops to or below the threshold, the above-described controller 22 writes the write information corresponding to the already received write request into the nonvolatile cache memory 222, using the power supplied from the power storage 23 for storing the power supplied from the power supply 30. From another point of view, the configuration can be considered to be such that the semiconductor device includes the above-described nonvolatile memory 21 and the above-described controller 22, and, if the voltage of the power supplied from the power supply 30 to the "semiconductor device" drops to or below the threshold, the controller 22 writes the write information corresponding to the already received write request into the nonvolatile cache memory 222, using the power supplied from the power storage 23 for storing the power supplied from the power supply 30. The configuration can also be considered to be such that the information processing device 1 includes the above-described nonvolatile memory 21 and the above-described controller 22, and, if the voltage of the power supplied from the power supply 30 to the "information processing device 1" drops to or below the threshold, the controller 22 writes the write information corresponding to the already received write request into the nonvolatile cache memory 222, using the power supplied from the power storage 23 for storing the power supplied from the power supply 30.

Figure 22:
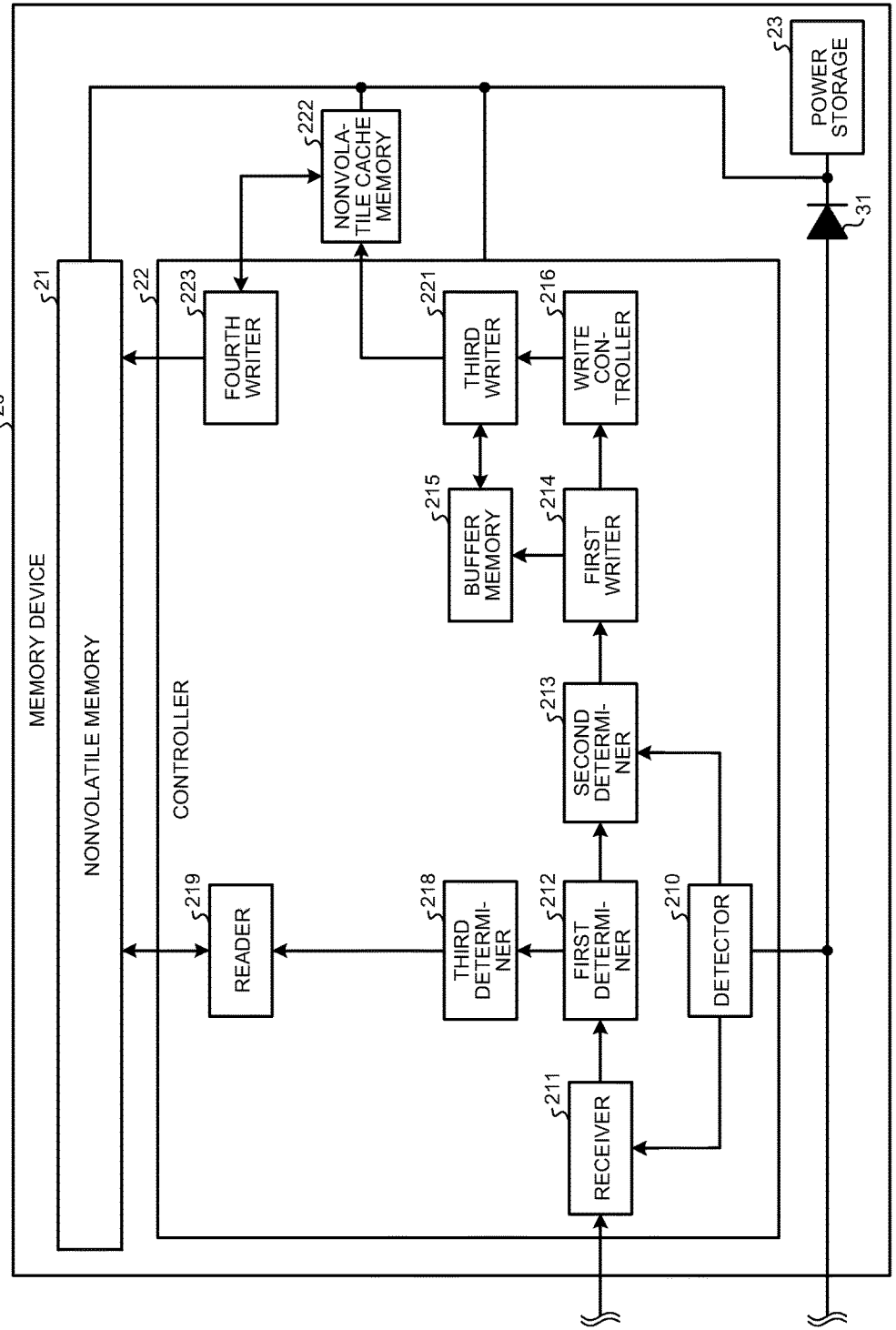
FIG. 22 is a diagram illustrating another example of the configuration of the memory device of the modification.
Figure 23:
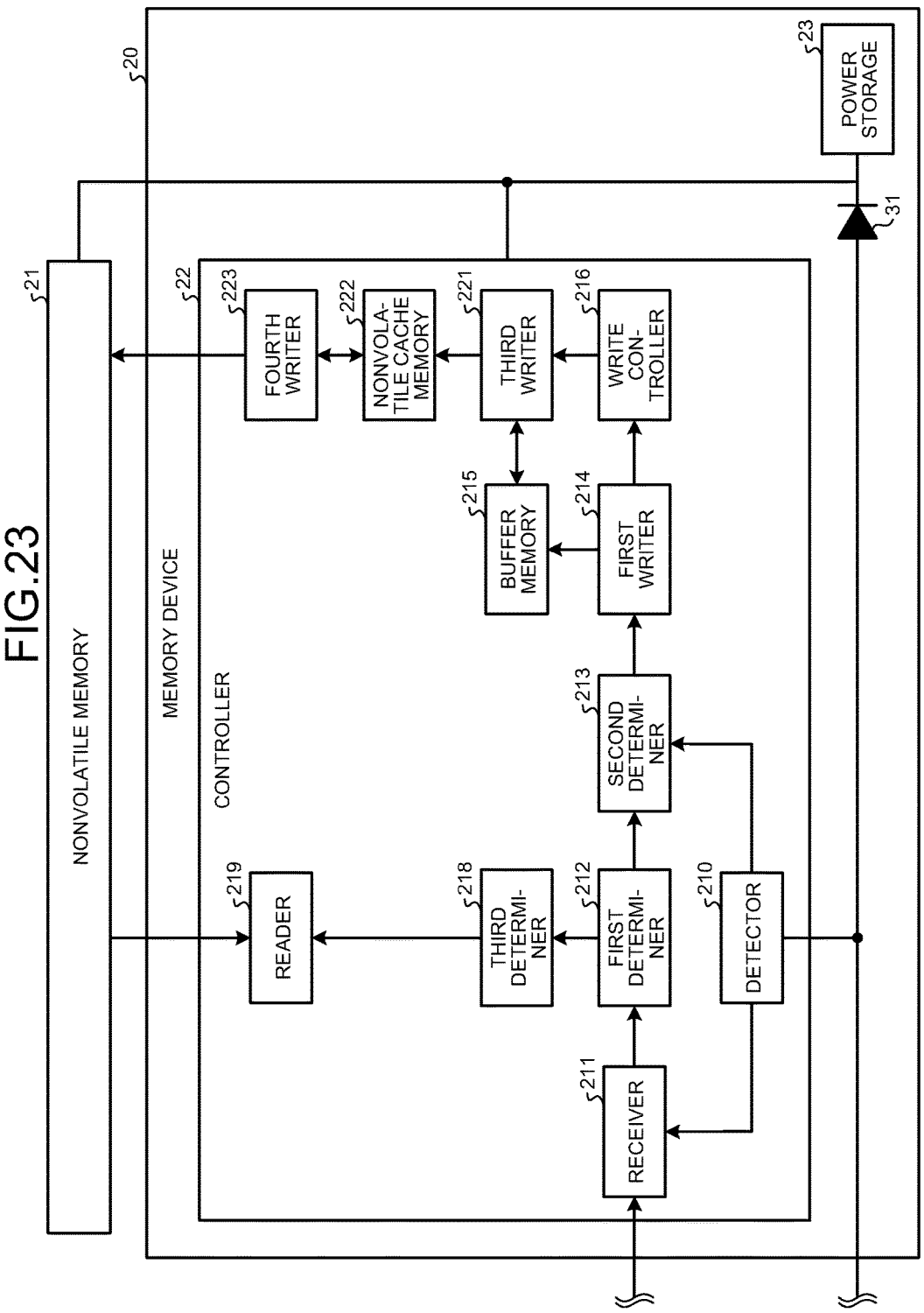
FIG. 23 is a diagram illustrating still another example of the configuration of the memory device of the modification.

Moreover, the configuration may, for example, be such that the nonvolatile cache memory 222 is provided external to the controller 22, as illustrated in FIG. 22, or such that an integrated assembly of the controller 22, the power storage 23, and the rectifying device 31 is provided independent of the nonvolatile memory 21, as illustrated in FIG. 23.

Third Embodiment

The following describes a third embodiment. Description will be omitted for parts common to those in each of the embodiments described above, where appropriate.

Figure 24:
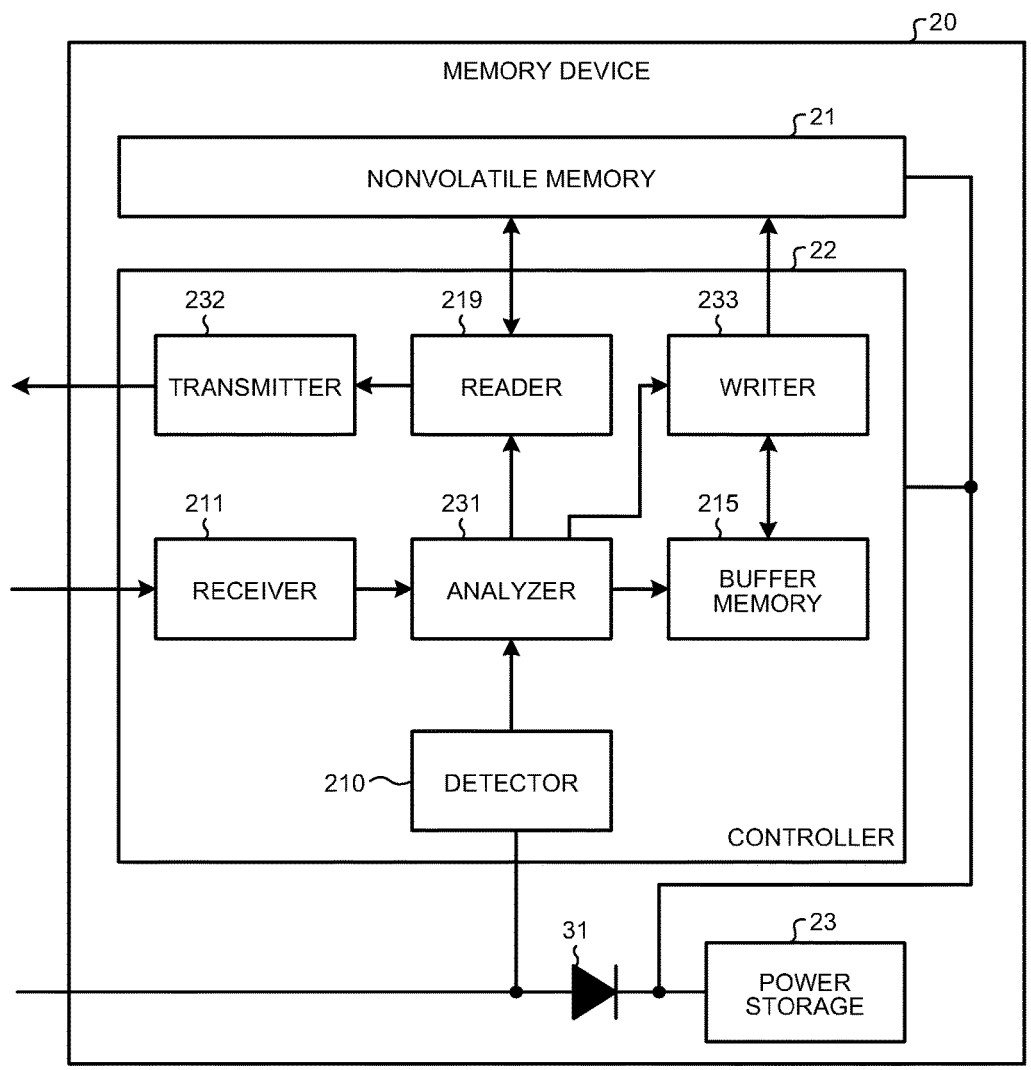
FIG. 24 is a diagram illustrating an example of the detailed configuration of the memory device according to a third embodiment.

FIG. 24 is a diagram illustrating an example of the detailed hardware configuration of the memory device 20 of the present embodiment. As illustrated in FIG. 24, the controller 22 includes the detector 210, the receiver 211, an analyzer 231, a transmitter 232, the buffer memory 215, a writer 233, and the reader 219. These components are each constituted by a semiconductor circuit, and may be provided independent of each other, or provided such that any two or more components are integrated. The memory device 30 of the present embodiment may be connected to the processor 10 serving as a host device, as in the case of the memory device 20 of FIG. 1, or may be connected to another memory device serving as a host device (memory device 20 of FIG. 9), as in the case of the second memory device 200 of FIG. 9. In the following description of the present embodiment, operations will be described in the case in which the memory device is connected to the processor 10 serving as a host device. However, the operations are also the same when the memory device is connected to another memory device serving as a host device.

The detector 210 detects the abnormality in the power supplied from the power supply 30 to the memory device 20. More specifically, the detector 210 monitors the power supplied from the power supply 30 to the memory device 20, and determines that the abnormality has occurred if the voltage of the power supplied from the power supply 30 drops to or below the threshold. After detecting the abnormality in the power supplied from the power supply 30 to the memory device 20, the detector 210 notifies the analyzer 231 that the abnormality has occurred, through a signal line informing that the abnormality has been detected. The method for detecting the abnormality in the power supplied from the power supply 30 to the memory device 20 is not limited to the method in which the detector 210 measures the voltage of the power supplied from the power supply 30 to the memory device 20, but may be, for example, a method in which the detector 210 receives a signal indicating the abnormality in the power from an external device, such as the power supply 30 or the processor 10. What is detected by the detector 210 is the fact that a situation has occurred in which the memory device 20 cannot continue a normal operation. The notification of the abnormality occurrence from the detector 210 to the analyzer 231 is a command for the memory device 20 to stop receiving a new write request from the processor 10, and also a command to write the data based on the already received write request into the nonvolatile memory, using also the power stored in the power storage 23 if the power supplied from the power supply 30 alone is not sufficient to write the data.

The receiver 211 receives the request (the write request or the read request) from the memory controller 13 of the processor 10. The controller 22 of the present embodiment receives the request (the write request or the read request)

over a plurality of clock cycles. Hence, the receiver 211 can be considered to sequentially receive, from the memory controller 13, respective fragments of information (request information) obtained by dividing the entire request into units each transmittable in one clock cycle. The analyzer 231 receives the request (or the fragments of information constituting the request) received by the receiver 211, and performs an analysis and necessary processing on the request. To absorb a difference in operation timing between the receiver 211 and the analyzer 231, a first-in-first-out (FIFO) queue is preferably provided that takes in the request (or the fragments of information constituting the request) received by the receiver 211 in the order received, and the analyzer 231 is preferably packaged so as to receive the request (or the fragments of information constituting the request) from the FIFO queue.

The transmitter 232 sends data read from the nonvolatile memory 21 based on the read request, as a result of reading, back to the memory controller 13 of the processor 10. A plurality of read requests are also provided that have different data sizes, such as 4, 8, 16, 32, and 64 bytes, so that transmitter 232 sends data having a length corresponding to each of the data sizes, as the result of reading, back to the processor 10 serving as the host device. The return of a result of processing of a received request, such as the result of reading corresponding to the read request, is generally called a response.

Figure 25:
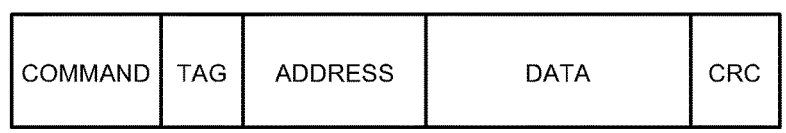
FIG. 25 is a diagram illustrating an example of the structure of a request of the third embodiment.

The general formats of the request and the response of the present embodiment have structures, for example, as illustrated in FIGS. 25 and 26. FIG. 25 is a diagram illustrating an example of the structure of the request. In the example of FIG. 25, the request includes fields of COMMAND, TAG, ADDRESS, DATA, and CRC. The COMMAND field is for information indicating whether the request is a write request or a read request and how many bytes the data length is. The TAG field is for a tag indicating a number for associating the request with the response. The result of reading corresponding to the read request having the tag with a certain number has a tag with the same number as that of the read request. The ADDRESS field is for information indicating a location of data to be read or written in the nonvolatile memory 21. The DATA field is for the data to be written in the write request. The length of the DATA field depends on the data size of the write request specified by the COMMAND. The request of the read request does not include the DATA field. The CRC (standing for cyclic redundancy code) field is for information for checking whether the entire request is correctly transmitted.

FIG. 26 is a diagram illustrating an example of the structure of the response. In the example of FIG. 26, the response includes fields of COMMAND, TAG, DATA, and CRC. The COMMAND field is for information indicating how many bytes are included in the read request corresponding to this response serving as a result of reading. The TAG field is for information indicating to which request this response corresponds. The DATA field is for the read-out data. The CRC field is for information for checking whether the entire response is correctly transmitted.

FIG. 27 illustrates an example of a 64-byte write request. The COMMAND field has information indicating that the request is a 64-byte write request. The TAG field specifies nothing (represented as "-", in this example) because this write request requires no response. The ADDRESS to which the data is to be written is "108A0", and the data to be written is "8F 42 . . . 0B 9D".

FIG. 28 illustrates an example of a 64-byte read request. The COMMAND field has information indicating that the request is a 64-byte read request. The TAG field is set to "7". The address from which the data is to be read is "21B498". FIG. 29 illustrates an example of a response of a result of reading corresponding to the read request. The COMMAND field has information indicating that the response is a result of reading corresponding to the 64-byte read request. The TAG field is set to "7", which is the same as the value in the corresponding read request. The DATA field has "48 BD . . . 53 A4" as the read-out data.

The example exhibited here illustrates the case in which the write request involves no response of a result of writing corresponding thereto. However, in the same way as in the case of the read request, the response of the result of writing can easily be made to the write request to inform that the writing has ended (or, the write request has been received).

The analyzer 231 of FIG. 24 analyzes the request received by the receiver 211 from the processor 10, and determines whether the request is a read request or a write request. If the request is a read request, the analyzer 231 commands the reader 219 to perform the reading processing, or, if the request is a write request, the analyzer 231 stores the data (writing target data) included in the write request in the buffer memory 215, and then, commands the writer 233 to write the data.

Figure 30:
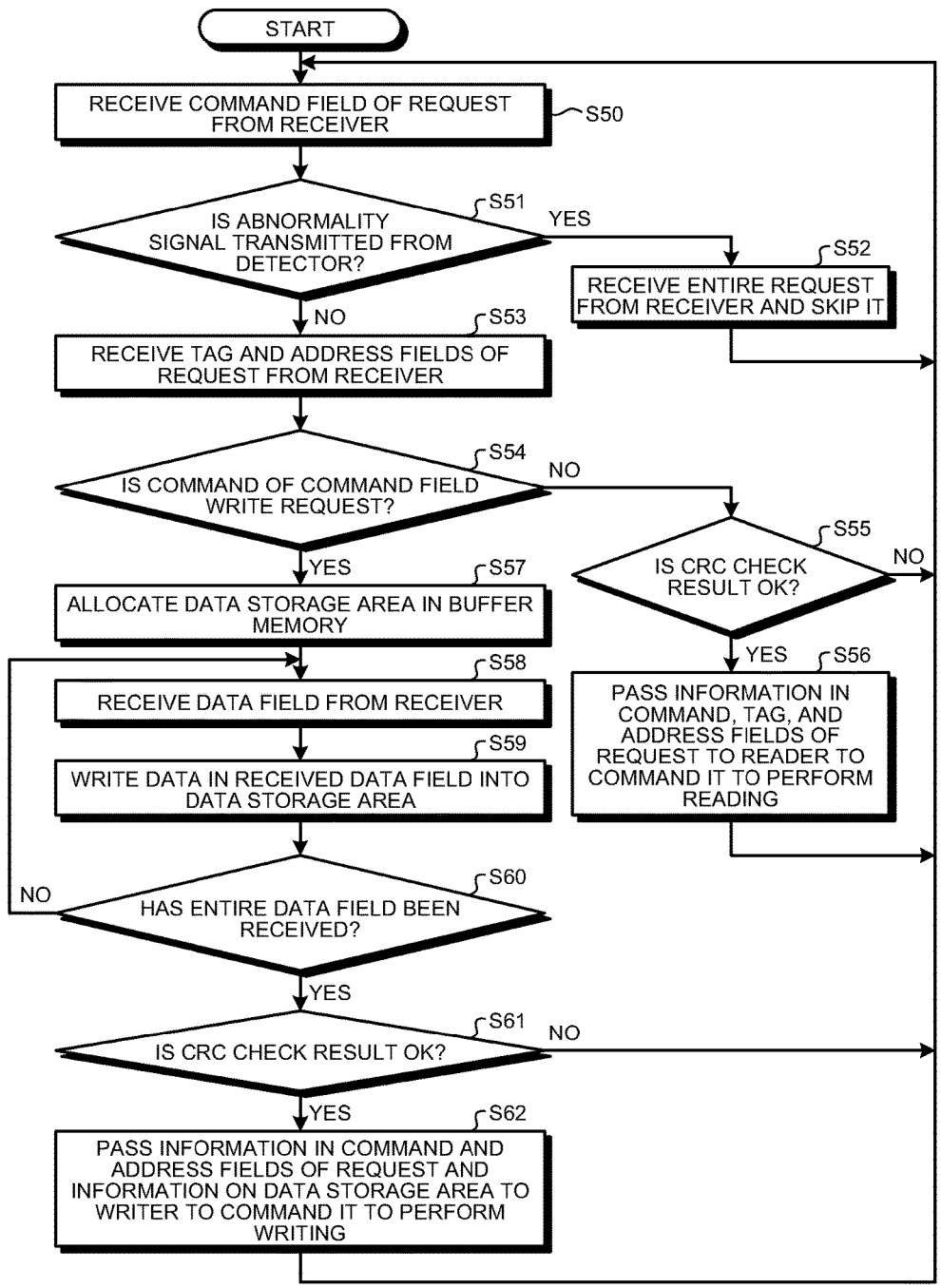
FIG. 30 is a diagram illustrating an example of the detailed operation of an analyzer of the third embodiment.

FIG. 30 is a flowchart illustrating an example of the detailed operation of the analyzer 231. The following describes the operation of the analyzer 231, based on FIG. 30. First, the analyzer 231 receives the COMMAND field of the request received by the receiver 211 from the processor 10 (Step S50). At this moment, the analyzer 231 extracts the COMMAND field from the first request if the receiver 211 has already received (and pushed into the FIFO queue) one or more requests. If the receiver 211 has received no request from the processor 10 (if the FIFO queue is empty), the analyzer 231 waits until the receiver 211 starts receiving a new request. After the receiver 211 has started receiving the request and has received at least the COMMAND field, the analyzer 231 receives the COMMAND field, and proceeds the processing even before the entire request is finished being received. The analyzer 231 may receive, from the receiver 211, other fields (such as the TAG field) together with the COMMAND field, instead of receiving the COMMAND field independently.

Then, the analyzer 231 checks whether an abnormality signal is transmitted from the detector 210 (Step S51). If an abnormality signal is transmitted from the detector 210 (Yes at Step S51), the analyzer 231 does not process a new subsequent request, so that the analyzer 231 receives the entire request from the receiver 211, skips the entire request without processing it (Step S52), and returns the process to Step S50. If an abnormality signal is not transmitted from the detector 210 (No at Step S51), the analyzer 231 receives the TAG field and the ADDRESS field of the request from the receiver 211 (Step S53). Also at this moment, the receiver 211 need not have received the entire request, but only needs to have received respective fragments of information corresponding to at least the TAG field and the ADDRESS field. The analyzer 231 then determines whether the command of the COMMAND field received previously is a write request or a read request (Step S54). If the command is a read request (No at Step S54), the analyzer 231 determines whether a CRC check is successful (Step S55). If the request is not correctly received (No at Step S55), the analyzer 231 ignores the request, and returns the process to Step S50. If the CRC check indicates that the request is correctly received (Yes at Step S55), the analyzer 231 passes the information of the COMMAND, the TAG, and the ADDRESS fields of the request to the reader 219 to command it to perform the reading processing (Step S56). The CRC check can be made using a method in which the analyzer 231 receives the CRC field from the receiver 211, and the analyzer 231 performs calculation based on the information in the other fields of the request to check the CRC. The CRC check is preferably made as follows: the receiver 211 calculates a CRC while receiving the request, compares it with the last received CRC field, and notifies the analyzer 231 of the result of the check.

If, at Step S54 described above, the command is a write request (Yes at Step S54), the analyzer 231 first allocates a data storage area in the buffer memory 215 (Step S57). The data storage area is an area in the buffer memory 215 for temporarily storing the data in the DATA field of the write request. Referring to the command reveals how many bytes of data are to be transmitted, so that the analyzer 231 allocates an area that can store data of that size. The analyzer 231 then receives the DATA field of the request from the receiver 211 (Step S58). The analyzer 231 then writes the data contained in the DATA field into the data storage area in the buffer memory 215 allocated at Step S57 (Step S59). At this moment, the analyzer 231 can receive the entire DATA field at a time if the receiver 211 has received the entire DATA field of the request from the processor 10. If, however, the receiver 211 is currently receiving the request, the analyzer 231 will receive only a part of the DATA field that has been received by that moment. Therefore, the analyzer 231 determines whether the entire DATA field of the request has been received from the receiver 211 (Step S60). If the entire DATA field has not been received (No at Step S60), the analyzer 231 returns the process to Step S58, and continues receiving the remaining part of the DATA field and writing the data into the data storage area. If the entire DATA field has been received (Yes at Step S60), the analyzer 231 then makes the CRC check, and determines whether the CRC check is successful (Step S61). If the entire request is confirmed to have been correctly received (Yes at Step S61), the analyzer 231 passes the information of the COMMAND and the ADDRESS fields of the request and information on the data storage area (addresses of the data storage area allocated in the buffer memory 215) to the writer 233 to command it to perform the writing processing (Step S62). If, as a result of the CRC check, the entire request has not been correctly received (No at Step S61), the analyzer 231 ignores the request, and returns the process to Step S50.

If a failure, such as the power supply abnormality, occurs, the remaining part of the request may fail to be transmitted while the receiver 211 has received only up to a part of the request. Therefore, if the power supply abnormality occurs while the analyzer 231 is operating based on the flowchart illustrated in FIG. 30, the analyzer 231 stops to receive any of the fields of the request from the receiver 211. As a result, if abnormality occurs, for example, in the power supply, a new subsequent request is prevented from being received and processed.

Figure 31:
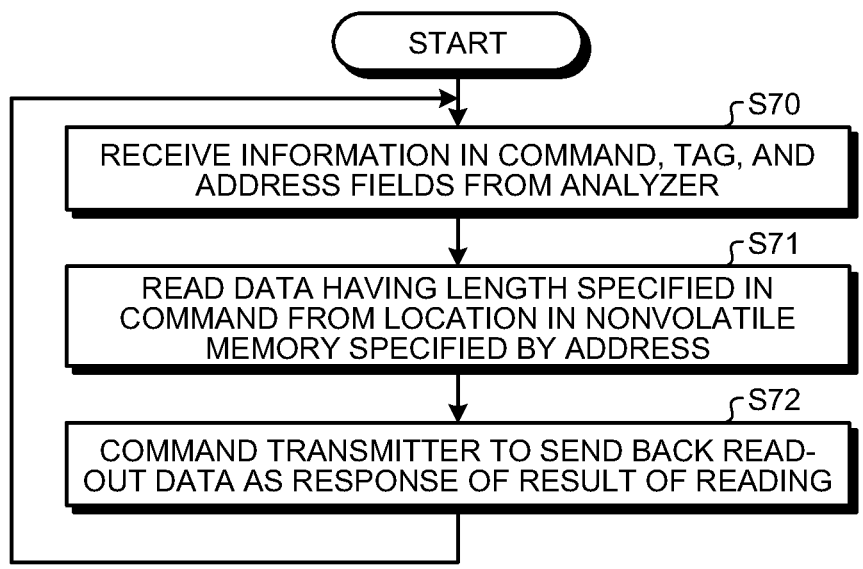
FIG. 31 is a diagram illustrating an example of the detailed operation of a reader of the third embodiment.

The description will be continued referring back to FIG. 24. Based on the command from the analyzer 231, the reader 219 of FIG. 24 reads the data from the nonvolatile memory 21, and sends the data back to the processor 10. The flowchart of FIG. 31 illustrates an example of the detailed operation of the reader 219. The following describes the operation of the reader 219, based on FIG. 31. As illustrated in FIG. 31, the reader 219 first receives, from the analyzer 231, the information of the COMMAND, the TAG, and the ADDRESS fields included in the read request (Step S70). The reader 219 then reads the data having a length (size) specified in the command, from a location in the nonvolatile memory 21 specified by the address (Step S71). The reader 219 then commands the transmitter 232 to send back the read-out data as the response of the result of reading (Step S72). In this case, based on the information in the COMMAND field received from the analyzer 231, the reader 219 selects a command for the response to be sent back, and passes, to the transmitter 232, the command for the response, the information in the TAG field received from the analyzer 231, and the data read from the nonvolatile memory 21, as information constituting the response. After sending back the response of the result of reading, the reader 219 returns the process to Step S70.

Figure 32:
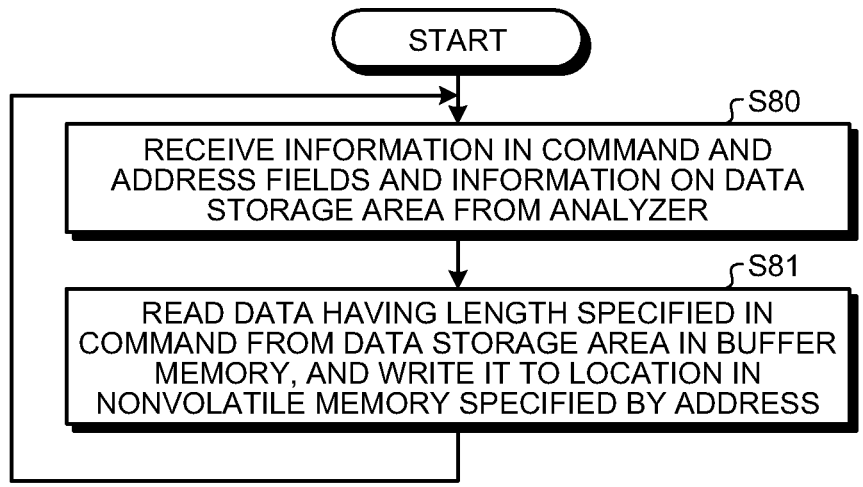
FIG. 32 is a diagram illustrating an example of the detailed operation of a writer of the third embodiment.

The description will be continued referring back to FIG. 24 again. Based on the command from the analyzer 231, the writer 233 of FIG. 24 writes the data into the nonvolatile memory 21. The flowchart of FIG. 32 illustrates an example of the detailed operation of the writer 233. The following describes the operation of the writer 233, based on FIG. 32. As illustrated in FIG. 32, the writer 233 first receives, from the analyzer 231, the information of the COMMAND and the ADDRESS fields included in the write request and the information on the data storage area (addresses of the data storage area in the buffer memory 215) (Step S80). The writer 233 then reads the data having a write data length (size) specified in the command, from the data storage area in the buffer memory 215, and writes the data to a location in the nonvolatile memory 21 specified by the address (Step S81). The process then returns to Step S80.

FIG. 24 illustrates a case in which separate signal lines are used, one being a signal line through which the receiver 211 receives the request from the processor 10, and the other being a signal line through which the transmitter 232 transmits the response to the processor 10. In this way, the signal lines for transmission and reception are often provided independent from each other to transmit and receive data at a high speed. Another method of transmission and reception may be employed in which a signal line is commonly used for transmission and reception, and the direction of signal flow is switched between a transmission mode and a reception mode.

As described above, also in the present embodiment, if the abnormality in the power supplied from the power supply 30 to the memory device 20 is detected, the controller 22 of the memory device 20 uses the power supplied from the power storage 23 to write the data based on the already received write request. That is, even if the abnormality occurs in the power supplied from the power supply 30 to the memory device 20, the power supplied from the power storage 23 can be used to complete the writing based on the already fully received write request. In addition, incomplete data based on the write request that is not fully received can be prevented from being written. As a result, according to the present embodiment, the atomicity can also be ensured with the configuration in which the memory device 20 is provided with the controller 22.

Modification of Third Embodiment

Figure 33:
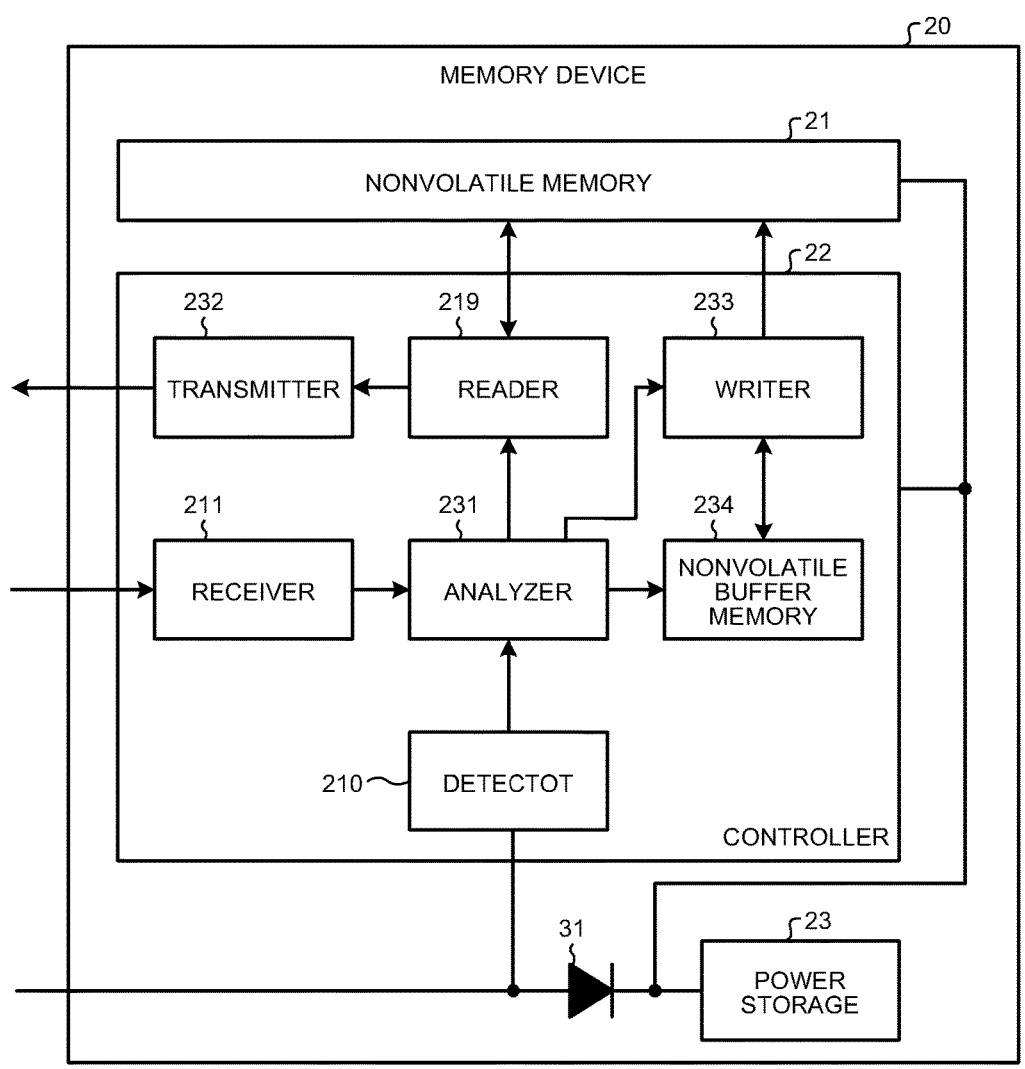
FIG. 33 is a diagram illustrating an example of the detailed configuration of the memory device according to a modification of the third embodiment.

A nonvolatile memory, for example, may be used as the buffer memory 215. While a volatile memory is used as the buffer memory 215 in the configuration of the third embodiment describe above, a nonvolatile memory (called a "nonvolatile buffer memory 234", in this example) may be used, for example, as illustrated in FIG. 33. Using the nonvolatile buffer memory 234 in this way can prevent the write data temporarily recorded in the nonvolatile buffer memory 234 from being lost even if the power supply failure occurs. As a result, even when the power supply failure occurs before the writing into the nonvolatile memory 21 is completed corresponding to the write request received by the memory device 20, the data to be written has been recorded in the data storage area in the nonvolatile buffer memory 234, and is thereby not lost. The data recorded in the data storage area in the nonvolatile buffer memory 234 only needs to be written into the nonvolatile memory 21 when the power is turned on next time. At least the information in the ADDRESS field needs to be recorded, in addition to the information in the DATA field of the write request, in the data storage area of this example. This is because it is necessary to identify the location (address) in the nonvolatile memory 21 into which the data in the data storage area is to be written after recovery from the failure. If the length (size) of the data to be written can be obtained from management data of the data storage area, the length of the data need not be additionally recorded in the data storage area. Otherwise, the data length or information indicating it (such as the information in the COMMAND field) is additionally recorded in the data storage area.

Fourth Embodiment

The following describes a fourth embodiment. Description will be omitted for parts common to those in each of the embodiments described above, where appropriate.

Figure 34:
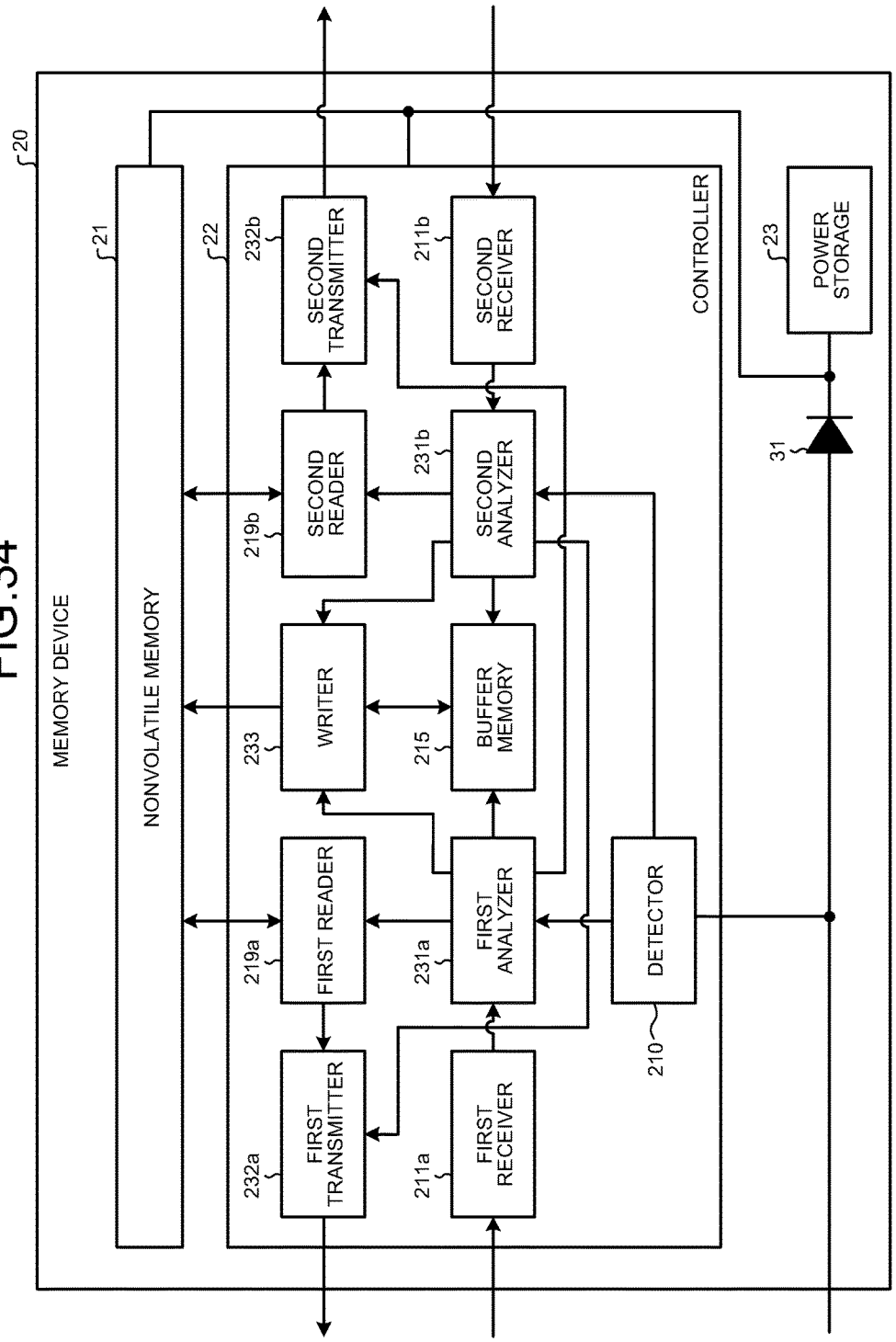
FIG. 34 is a diagram illustrating an example of the detailed configuration of the memory device according to a fourth embodiment.

FIG. 34 is a diagram illustrating an example of the detailed hardware configuration of the memory device 20 of the present embodiment. The configuration is basically the same as that of the third embodiment describe above, but is a two-port configuration including two such transmitters 232 and two such receivers 211. Accordingly, two such analyzers 231 and two such readers 219 are included. The memory device 20 of the present embodiment may be connected to the processor 10 serving as the host device through a plurality of channels as illustrated in FIG. 7, or may be connected to a plurality of processors (the processors 10a and 10b of FIG. 8) serving as host devices as illustrated in FIG. 8. As in the case of the memory device 20 of FIG. 9, the memory device 20 can be connected, via one port thereof, to the processor 10 serving as the host device, and connected, via the other port thereof, to another memory device (second memory device 200 of FIG. 9) while serving as another host device. In addition, as in the case of the memory device 20 of FIG. 10, the memory device 20 can be connected, via one port thereof, to the processor 10 serving as the host device, and connected, via the other port thereof, to another memory device (second memory device 200 of FIG. 9) to serve as another host device together with the other memory device.

In the hardware configuration of the memory device 20 of the present embodiment illustrated in FIG. 34, the operations of the detector 210, the buffer memory 215, and the writer 233 are the same as those of the third embodiment illustrated in FIG. 24. The present embodiment differs from the third embodiment by including the two transmitters 232, the two receivers 211, the two analyzers 231, and the two readers 219, where these pairs of units include first and second transmitters 232a and 232b, first and second receivers 211a and 211b, first and second analyzers 231a and 231b, and first and second readers 219a and 219b, respectively. This configuration involves partial differences in the operations of the analyzers 231. These components are each constituted by a semiconductor circuit, and may be provided independent of each other, or provided such that any two or more components are integrated.

Figure 35:
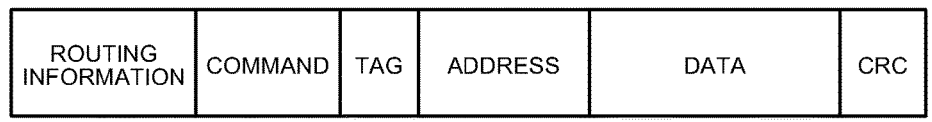
FIG. 35 is a diagram illustrating an example of the structure of a request of the fourth embodiment.
Figure 36:
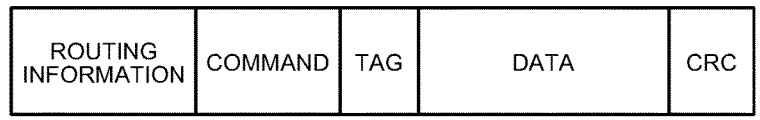
FIG. 36 is a diagram illustrating an example of the structure of a response of the fourth embodiment.

The general formats of the request and the response of the present embodiment have structures, for example, as illustrated in FIGS. 35 and 36. The structures differ from those of the request and the response of the third embodiment illustrated in FIGS. 25 and 26 by each including a field for routing information. The routing information is information for determining to which memory device 20 or host device (processor 10) the request or the response has been transmitted. For example, a unique number can be given to each host device and each of such memory devices 20 to use the number as the routing information. For example, in the case of the HMC memory device, a cube ID included in the request and a source link ID included in the response correspond to the routing information of the present embodiment.

Figure 39:
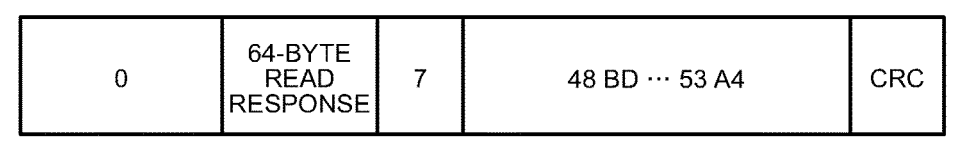

FIG. 37 illustrates an example of the 64-byte write request. This example includes "1", as the routing information, in addition to the example of FIG. 27. FIG. 38 illustrates an example of the 64-byte read request. This example includes "1", as the routing information, in addition to the example of FIG. 28. The routing information "1" represents, for example, a certain memory device. FIG. 39 illustrates an example of the response of the result of reading corresponding to this read request. This example includes "0", as the routing information, in addition to the example of FIG. 29. The routing information "0" represents, for example, a host device connected to one of the memory devices 20.

The example exhibited here illustrates the case in which the write request involves no response of a result of writing corresponding thereto. However, in the same way as in the case of the read request, the response of the result of writing can easily be made to the write request to inform that the writing has ended (or, the write request has been received).

Each of the analyzers 231 of FIG. 34 analyzes a request received by corresponding one of the receivers 211 from a host device, and determines whether the request is a read request or a write request. If the request is a read request, the analyzer 231 commands corresponding one of the readers to perform the reading processing, or, if the request is a write request, the analyzer 231 stores the data included in the write request in the buffer memory 215, and then, commands the writer 233 to write the data.

Figure 40:
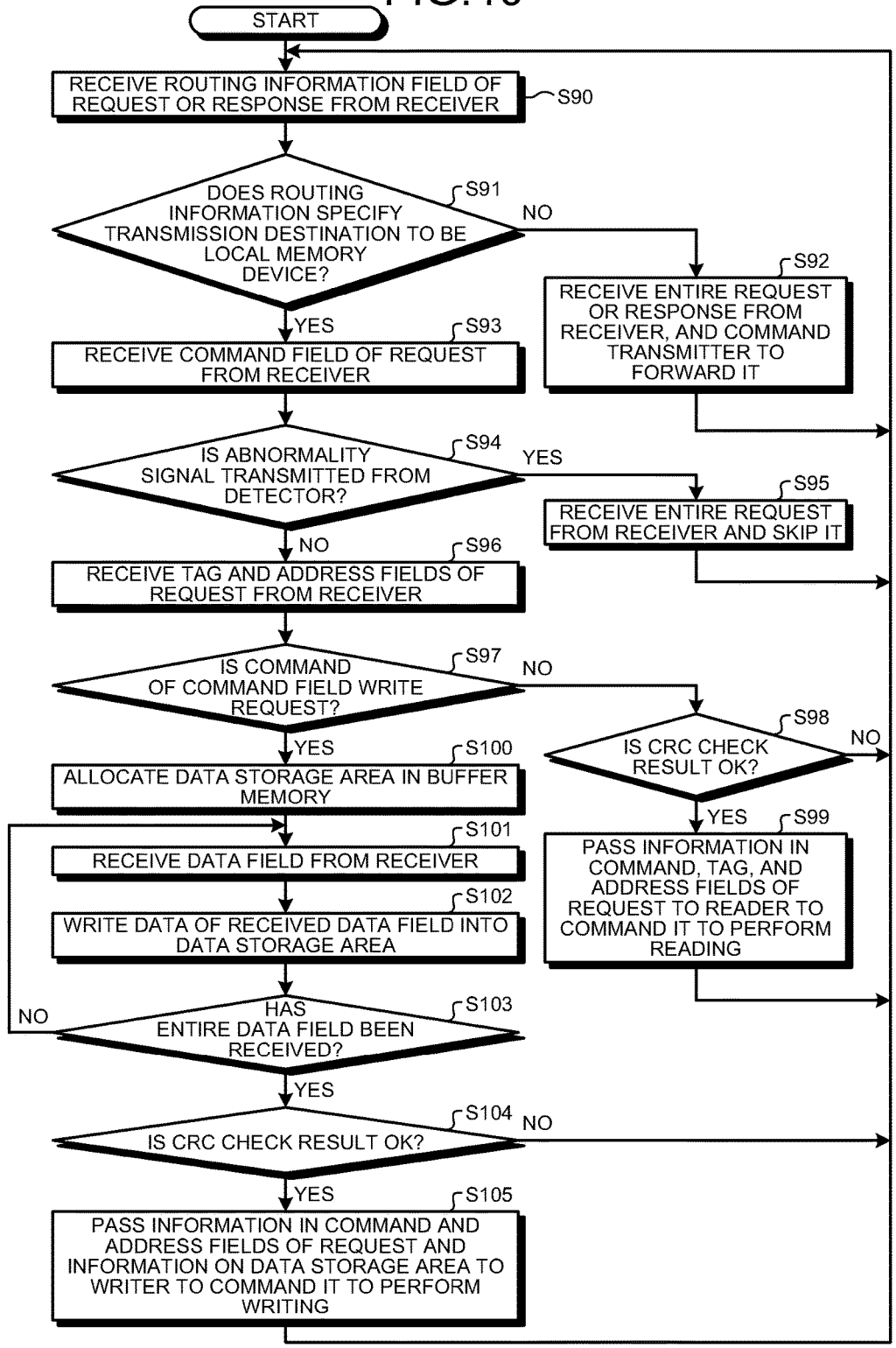
FIG. 40 is a diagram illustrating an example of the detailed operation of each analyzer of the fourth embodiment.

FIG. 40 is a flowchart illustrating an example of the detailed operation of each of the first and second analyzers 231a and 231b. The following describes the operation of the first analyzer 231a (second analyzer 231b), based on FIG. 40. First, the first analyzer 231a (second analyzer 231b) receives the routing information field of the request or response received by the first receiver 211a (second receiver 211b) from one of the processors 10 serving as a host device or one of the other memory devices 20 (Step S90). At this moment, the first analyzer 231a (second analyzer 231b) extracts the routing information field from the first request or response if the first receiver 211a (second receiver 211b) has already received (and pushed into the FIFO queue) one or more requests or responses. If the first receiver 211a (second receiver 211b) has received no request or response from the host device or the other memory device 20 (if the FIFO queue is empty), the first analyzer 231a (second analyzer 231b) waits until the first receiver 211a (second receiver 211b) starts receiving a new request or response. After the first receiver 211a (second receiver 211b) has started receiving the request or response and has received at least the routing information field, the first analyzer 231a (second analyzer 231b) receives the routing information field, and proceeds the processing even before the entire request or response is finished being received. The first analyzer (second analyzer) may receive, from the first receiver 211a (second receiver 211b), other fields (such as the COMMAND field) together with the routing information field, instead of receiving the routing information field independently.

Then, the first analyzer 231a (second analyzer 231b) checks whether the routing information in the routing information field received at Step S90 specifies the transmission destination to be the local memory device 20 (Step S91). The routing information for specifying the local memory device 20 may be set to a fixed value in advance, or may be settable to a value in a register for control. The first analyzer 231a (second analyzer 231b) can determine whether the transmission destination is the local memory device 20 by comparing the value with that in the routing information field. If the routing information specifies another memory device 20 (No at Step S91), the first analyzer 231a (second analyzer 231b) receives the entire request or response, and commands the second transmitter 232b (first transmitter 232a) to forward it (Step S92). The process then returns to Step S90.

If the routing information specifies the transmission destination to be the local memory device (Yes at Step S91), the first analyzer 231a (second analyzer 231b) receives the COMMAND field from the first receiver 211a (second receiver 211b) (Step S93). Also at this moment, the first receiver 211a (second receiver 211b) need not have received the entire request, but only needs to have received fragmentary information corresponding to at least the COMMAND field. If the first receiver 211a (second receiver 211b) has not received the fragmentary information corresponding to the COMMAND field, the first analyzer 231a (second analyzer 231b) waits until the first receiver 211a (second receiver 211b) receives the fragmentary information corresponding to the COMMAND field.

Then, the first analyzer 231a (second analyzer 231b) checks whether the abnormality signal is transmitted from the detector 210 (Step S94). If the abnormality signal is transmitted from the detector 210 (Yes at Step S94), the first analyzer 231a (second analyzer 231b) does not process a new subsequent request, so that the first analyzer 231a (second analyzer 231b) receives the entire request from the first receiver 211a (second receiver 211b), skips the entire request without processing it, and returns the process to Step S90. If the abnormality signal is not transmitted from the detector 210 (No at Step S94), the first analyzer 231a (second analyzer 231b) receives the TAG field and the ADDRESS field of the request from the first receiver 211a (second receiver 211b) (Step S96). Also at this moment, the first receiver 211a (second receiver 211b) need not have received the entire request, but only needs to have received fragmentary information corresponding to at least the TAG field and the ADDRESS field. If the first receiver 211a (second receiver 211b) has not received the fragmentary information corresponding to the TAG field and the ADDRESS field, the first analyzer 231a (second analyzer 231b) waits until the first receiver 211a (second receiver 211b) receives the fragmentary information corresponding to the TAG field and the ADDRESS field. The first analyzer 231a (second analyzer 231b) then determines whether the command of the COMMAND field received previously is a write request or a read request (Step S97). If the command is a read request (No at Step S97), the first analyzer 231a (second analyzer 231b) determines whether a CRC check is successful (Step S98). If the request is not correctly received (No at Step S98), the first analyzer 231a (second analyzer 231b) ignores the request, and returns the process to Step S90. If the CRC check indicates that the request is correctly received (Yes at Step S98), the first analyzer 231a (second analyzer 231b) passes the information of the COMMAND, the TAG, and the ADDRESS fields of the request to the first reader 219a (second reader 219b) to command it to perform the reading processing (Step S99). The CRC check can be made using a method in which the first analyzer 231a (second analyzer 231b) receives the CRC field from the first receiver 211a (second receiver 211b), and the first analyzer 231a (second analyzer 231b) performs calculation based on the information in the other fields of the request to check the CRC. The CRC check is preferably made as follows: the first receiver 211a (second receiver 211b) calculates a CRC while receiving the request, compares it with the last received CRC field, and notifies the first analyzer 231a (second analyzer 231b) of the result of the check.

If, at Step S97 described above, the command is a write request (Yes at Step S97), the first analyzer 231a (second analyzer 231b) first allocates the data storage area in the buffer memory 215 (Step S100). The data storage area is an area in the buffer memory 215 for temporarily storing the data in the DATA field of the write request. Referring to the command reveals how many bytes of data are to be transmitted, so that the first analyzer 231a (second analyzer 231b) allocates an area that can store data of that size. The first analyzer 231a (second analyzer 231b) then receives the DATA field of the request from the first receiver 211a (second receiver 211b) (Step S101). The first analyzer 231a (second analyzer 231b) then writes the data contained in the DATA field into the data storage area in the buffer memory 215 allocated at Step S100 (Step S102). At this moment, the first analyzer 231a (second analyzer 231b) can receive the entire DATA field at a time if the first receiver 211a (second receiver 211b) has received the entire DATA field of the request from the host device or the other memory device 20. If, however, the first receiver 211a (second receiver 211b) is currently receiving the request, the first analyzer 231a (second analyzer 231b) will receive only a part of the DATA field that has been received by that moment. Therefore, the first analyzer 231a (second analyzer 231b) determines whether the entire DATA field of the request has been received from the first receiver 211a (second receiver 211b) (Step S103). If the entire DATA field has not been received (No at Step S103), the first analyzer 231a (second analyzer 231b) returns the process to Step S101, and continues receiving the remaining part of the DATA field and writing the data into the data storage area. If the entire DATA field has been received (Yes at Step S103), the first analyzer 231a (second analyzer 231b) then performs the CRC check, and determines whether the CRC check is successful (Step S104). If the entire request is confirmed to have been correctly received (Yes at Step S104), the first analyzer 231a (second analyzer 231b) passes the information of the COMMAND and the ADDRESS fields of the request and the information on the data storage area (addresses of the data storage area allocated in the buffer memory) to the writer 233 to command it to perform the writing processing (Step S105). If, as a result of the CRC check, the entire request has not been correctly received (No at Step S104), the first analyzer 231a (second analyzer 231b) ignores the request, and returns the process to Step S90.

If a failure, such as the power supply abnormality, occurs, the remaining part of the request or response may fail to be transmitted while the first receiver 211a (second receiver 211*b*) has received only up to a part of the request. Therefore, if the power supply abnormality occurs while the first analyzer 231*a* (second analyzer 231*b*) is operating based on the flowchart illustrated in FIG. 40, the first analyzer 231*a* (second analyzer 231*b*) stops to receive any of the fields of the request from the first receiver 211*a* (second receiver 211*b*). As a result, if abnormality occurs, for example, in the power supply, a new subsequent request from the host device is prevented from being received and processed.

Based on the command from the first analyzer 231*a* and the second analyzer 231*b*, the first reader 219*a* and the second reader 219*b* of FIG. 34 each read the data from the nonvolatile memory 21 and send the data back to the host device or the other memory device 20. The flowchart of FIG. 41 illustrates an example of the detailed operation of the first reader 219*a* (second reader 219*b*). The following describes the operation of the first reader 219*a* (second reader 219*b*), based on FIG. 41. The first reader 219*a* (second reader 219*b*) first receives, from the first analyzer 231*a* (second analyzer 231*b*), the information of the COMMAND, the TAG, and the ADDRESS fields included in the read request (Step S110). The first reader 219*a* (second reader 219*b*) then reads the data having a length (size) specified in the COMMAND, from a location in the nonvolatile memory 21 specified by the ADDRESS (Step S111). The first reader 219*a* (second reader 219*b*) then commands the first transmitter 232*a* (second transmitter 232*b*) to send back the read-out data as the response of the result of reading (Step S112). In this case, based on the information in the COMMAND field received from the first analyzer 231*a* (second analyzer 231*b*), the first reader 219*a* (second reader 219*b*) selects a command for the response to be sent back, and passes, to the first transmitter 233*a* (second transmitter 233*b*), the command for the response, the information in the TAG field received from the first analyzer 231*a* (second analyzer 231*b*), and the data read from the nonvolatile memory 21, as information constituting the response. After sending back the response of the result of reading, the first reader 219*a* (second reader 219*b*) returns the process to Step S110.

Based on the command from the analyzers 231, the writer 233 of FIG. 34 writes the data into the nonvolatile memory 21. The flowchart of FIG. 42 illustrates an example of the detailed operation of the writer 233. The operation of the writer 233 will be described based on FIG. 42. The writer 233 first receives, from the first analyzer 231*a* (second analyzer 231*b*), the information of the COMMAND and the ADDRESS fields included in the write request and the information on the data storage area (addresses of the data storage area in the buffer memory) (Step S120). The writer 233 then reads the data having a write data length (size) specified in the COMMAND, from the data storage area in the buffer memory, and writes the data to a location in the nonvolatile memory specified by the ADDRESS (Step S121). The process then returns to Step S120.

FIG. 34 illustrates a case in which separate signal lines are used, one being a signal line through which the first receiver 211*a* (second receiver 211*b*) receives the request from the host device or the other memory device 20, and the other being a signal line through which the first transmitter 232*a* (second transmitter 232*b*) transmits the response to the host device or the other memory device 20. In this way, the signal lines for transmission and reception are often provided independent from each other to transmit and receive data at a high speed. Another method of transmission and reception may be employed in which a signal line is commonly used for transmission and reception, and the direction of signal flow is switched between the transmission mode and the reception mode.

While the configuration illustrated in FIG. 34 includes two ports (signal lines for transmitting and receiving signals), the number of ports can easily be increased to three. In that case, the controller 22 stores management information that indicates which of the transmitters 232 should transmit the request or response if the destination of the request or response received by either of the receivers 211 turns out to be not the local memory device 20 as a result of reference to the number serving as the routing information of the request or response. Each of the analyzers 231 forwards the request or response from appropriate one of the transmitters 232, with reference to the information.

In the above-described way, even in the case of using a combination of the memory devices 20 and the processors 10, when one or more of the processors 10 (host devices) connected to any of the memory devices 20 transmits (or transmit) a write request (or write requests) to any of the memory devices 20 before the abnormality in the power occurs, the write request (or write requests) can be guaranteed to be forwarded to the target memory device 20 (or target memory devices 20) without fail, and the data based on the write request (or write requests) can be guaranteed to be written. In addition, incomplete data based on the write request that is not fully received can be prevented from being written, and the request or response can be continued to be forwarded to or from the other memory device.

Modification of Fourth Embodiment

In the fourth embodiment illustrated in FIG. 34, the first reader 219*a* and the second reader 219*b* are separately provided. The readers 219 may, however, be integrated into one unit, and configured to receive commands for the reading processing from both the first analyzer 231*a* and the second analyzer 231*b*. In this case, the reader 219 is connected to both the first transmitter 232*a* and the second transmitter 232*b*, and, when either of the first analyzer 231*a* and the second analyzer 231*b* commands the reader 219 to perform the reading processing, the analyzer 231 passes thereto information for determining which of the first transmitter 232*a* and the second transmitter 232*b* should send back the response of the result of reading.

The embodiments and the modifications thereof described above can be combined in any desired manner.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a nonvolatile memory;
a controller configured to receive, from a host device, a write request for writing data into the nonvolatile memory, and then, write the data based on the write request; and
power storage configured to store power supplied from a power supply, wherein the controller writes, when abnormality in power supplied from the power supply to the memory device is detected, the data based on the write request that has already been received, using the power supplied from the power storage, the memory device is connected to a second memory device, when receiving, from the host device, a second write request requesting writing of data into the second memory device, the controller forwards the second write request to the second memory device, and the controller forwards, when the abnormality in the power supplied from the power supply to the memory device is detected, the second write request that has already been received to the second memory device, using the power supplied from the power storage.

2. The memory device according to claim 1, wherein the controller stops, when the abnormality in the power supplied from the power supply to the memory device is detected, receiving the write request.

3. The memory device according to claim 1, wherein the controller does not write, when the abnormality in the power supplied from the power supply to the memory device is detected, the data based on the write request currently being received from the host device.

4. The memory device according to claim 1, wherein the controller receives the write request over a plurality of clock cycles.

5. The memory device according to claim 1, further comprising a buffer memory configured to temporarily store information, wherein the controller stores writing target data included in the write request received from the host device in the buffer memory, and then, writes the data based on the writing target data stored in the buffer memory.

6. The memory device according to claim 1, wherein the power storage is a capacitor, a capacity of which is set to a value that allows the capacitor to store an amount of power required for at least writing the data based on the write request that has already been received when the abnormality has occurred in the power supplied from the power supply to the memory device.

7. A memory device comprising:

a nonvolatile memory;

a controller configured to receive, from a host device, a write request for writing data into the nonvolatile memory, and then, write the data based on the write request; and power storage configured to store power supplied from a power supply, wherein the controller writes, when abnormality in power supplied from the power supply to the memory device is detected, the data based on the write request that has already been received, using the power supplied from the power storage the memory device is connected to a second memory device, the controller receives, from the second memory device, a third write request through which a second host device different from the host device requests writing of data into the nonvolatile memory, and then, writes the data based on the third write request, and the controller continues, when the abnormality in the power supplied from the power supply to the memory device is detected and when the third write request is currently being received from the second memory device, receiving the third write request from the second memory device, using the power supplied from the power storage.

8. The memory device according to claim 7, wherein the controller writes the data based on the third write request that has been fully received, using the power supplied from the power storage.

9. The memory device according to claim 7, wherein the controller determines that the abnormality has occurred in the power supplied from the power supply to the memory device when a voltage of the power supplied from the power supply to the memory device drops to or below a threshold.

10. The memory device according to claim 1, wherein the controller determines that the abnormality has occurred in the power supplied from the power supply to the memory device when a voltage of the power supplied from the power supply to the memory device drops to or below a threshold.

11. A memory device comprising:

a nonvolatile memory;

a controller configured to receive, from a second memory device connected to the memory device, a write request through which a host device requests writing of data into the nonvolatile memory, and then, write the data based on the write request; and power storage configured to store power supplied from a power supply, wherein the controller writes, when abnormality in power supplied from the power supply to the memory device is detected, the data based on the write request that has already been received, using the power supplied from the power storage, and the controller continues, when the write request is currently being received from the second memory device, receiving the write request from the second memory device, using the power supplied from the power storage.

12. A memory device comprising:

a nonvolatile memory; and a controller configured to receive, from a host device, a write request for writing data into the nonvolatile memory, and then, write the data based on the write request, wherein the controller writes, when abnormality in power supplied from a power supply to the memory device is detected, using power supplied from power storage storing the power supplied from the power supply, the data based on the write request that has already been received, the memory device is connected to a second memory device, when receiving, from the host device, a second write request requesting writing of data into the second memory device, the controller forwards the second write request to the second memory device, and the controller forwards, when the abnormality in the power supplied from the power supply to the memory device is detected, the second write request that has already been received to the second memory device, using the power supplied from the power storage.

13. A memory device comprising:

a nonvolatile cache memory;

a controller configured to receive, from a host device, a write request for writing data into a nonvolatile memory, and then, write information corresponding to the write request into the nonvolatile cache memory; and power storage configured to store power supplied from a power supply, wherein the controller writes, when abnormality in power supplied from the power supply to the memory device is detected, the write information corresponding to the write request that has already been received into the nonvolatile cache memory, using the power supplied from the power storage, the memory device is connected to a second memory device, when receiving, from the host device, a second write request requesting writing of data into the second memory device, the controller forwards the second write request to the second memory device, and the controller forwards, when the abnormality in the power supplied from the power supply to the memory device is detected, the second write request that has already been received to the second memory device, using the power supplied from the power storage.

14. A memory device comprising:

a nonvolatile cache memory; and a controller configured to receive, from a host device, a write request for writing data into a nonvolatile memory, and then, write information corresponding to the write request into the nonvolatile cache memory, wherein the controller writes, when abnormality in power supplied from a power supply to the memory device is detected, the write information corresponding to the write request that has already been received into the nonvolatile cache memory, using power supplied from power storage storing the power supplied from the power supply, the memory device is connected to a second memory device, when receiving, from the host device, a second write request requesting writing of data into the second memory device, the controller forwards the second write request to the second memory device, and the controller forwards, when the abnormality in the power supplied from the power supply to the memory device is detected, the second write request that has already been received to the second memory device, using the power supplied from the power storage.

* * * * *